US007915520B2

(12) United States Patent
Nishimura et al.

(10) Patent No.: US 7,915,520 B2
(45) Date of Patent: Mar. 29, 2011

(54) PHOTOELECTRIC CONVERSION DEVICE AND MANUFACTURING METHOD THEREOF

(75) Inventors: Kazuhito Nishimura, Katsuragi (JP); Yoshiyuki Nasuno, Kashihara (JP); Hiroshi Yamamoto, Gose (JP); Yoshitaka Sugita, Habikino (JP)

(73) Assignee: Sharp Kabushiki Kaisha, Osaka (JP)

( * ) Notice: Subject to any disclaimer, the term of this patent is extended or adjusted under 35 U.S.C. 154(b) by 977 days.

(21) Appl. No.: 11/087,819

(22) Filed: Mar. 24, 2005

(65) Prior Publication Data

US 2005/0229965 A1 Oct. 20, 2005

(30) Foreign Application Priority Data

Mar. 24, 2004 (JP) ................................. 2004-086811
Sep. 3, 2004 (JP) ................................. 2004-257181
Oct. 22, 2004 (JP) ................................. 2004-308381

(51) Int. Cl.
*H01L 31/00* (2006.01)
(52) U.S. Cl. ........ 136/255; 136/261; 136/258; 136/252; 257/51; 257/52; 257/55; 257/49; 257/66; 438/69; 438/96; 438/97
(58) Field of Classification Search .................. 136/255, 136/261, 258, 252; 257/51, 52, 55, 49, 66; 438/69, 96, 97
See application file for complete search history.

(56) References Cited

U.S. PATENT DOCUMENTS

| | | | | |
|---|---|---|---|---|
| 4,385,199 A | * | 5/1983 | Hamakawa et al. | 136/258 |
| 4,385,200 A | * | 5/1983 | Hamakawa et al. | 136/258 |
| 4,419,533 A | * | 12/1983 | Czubatyj et al. | 136/259 |
| 4,453,173 A | | 6/1984 | Carlson et al. | |
| 4,469,715 A | | 9/1984 | Madan | |
| 4,612,559 A | | 9/1986 | Hitotsuyanagi et al. | |
| 4,613,382 A | * | 9/1986 | Katayama et al. | 438/488 |
| 4,689,093 A | * | 8/1987 | Ishihara et al. | 438/96 |
| 4,775,425 A | | 10/1988 | Guha et al. | |
| 4,776,894 A | * | 10/1988 | Watanabe et al. | 136/249 |
| 4,801,468 A | | 1/1989 | Ishihara et al. | |
| 4,891,330 A | * | 1/1990 | Guha et al. | 438/488 |
| 4,907,052 A | * | 3/1990 | Takada et al. | 257/458 |
| 5,140,397 A | | 8/1992 | Haga et al. | |
| 5,151,255 A | * | 9/1992 | Fukuda et al. | 422/186.05 |
| 5,246,506 A | * | 9/1993 | Arya et al. | 136/249 |
| 5,252,142 A | * | 10/1993 | Matsuyama et al. | 136/255 |
| 5,382,809 A | * | 1/1995 | Nishibayashi et al. | 257/77 |
| 5,456,762 A | | 10/1995 | Kariya et al. | |
| 5,866,471 A | * | 2/1999 | Beppu et al. | 438/502 |

(Continued)

FOREIGN PATENT DOCUMENTS

| | | |
|---|---|---|
| JP | 57-136377 | 8/1982 |
| JP | 61-090476 | 5/1986 |
| JP | 63-047987 | 2/1988 |
| JP | 63-084074 | 4/1988 |
| JP | 03-029373 | 2/1991 |

(Continued)

OTHER PUBLICATIONS

Online machine translation of JP 2002-016271A, Jan. 2002.*

*Primary Examiner* — Alexa D Neckel
*Assistant Examiner* — Golam Mowla
(74) *Attorney, Agent, or Firm* — Nixon & Vanderhye P.C.

(57) ABSTRACT

A photoelectric conversion device comprising: a pin-type photoelectric conversion layer constituted of a p-type semiconductor layer, an i-type semiconductor layer and an n-type semiconductor layer, wherein the p-type semiconductor layer contains silicon atoms and nitrogen atoms, which is possible to improve photoelectric conversion efficiency.

8 Claims, 8 Drawing Sheets

U.S. PATENT DOCUMENTS

| | | | |
|---|---|---|---|
| 6,100,466 A * | 8/2000 | Nishimoto | 136/258 |
| 6,184,456 B1 * | 2/2001 | Matsuyama et al. | 136/256 |
| 6,252,923 B1 * | 6/2001 | Iacovino et al. | 376/272 |
| 6,337,224 B1 * | 1/2002 | Okamoto et al. | 438/69 |
| 6,399,873 B1 * | 6/2002 | Sano et al. | 136/249 |
| 6,488,995 B1 * | 12/2002 | Nishimoto et al. | 427/574 |
| 2002/0033191 A1 * | 3/2002 | Kondo et al. | 136/249 |
| 2002/0166581 A1 * | 11/2002 | Kondo et al. | 136/258 |

FOREIGN PATENT DOCUMENTS

| | | |
|---|---|---|
| JP | 05-048129 | 2/1993 |
| JP | 06-005892 | 1/1994 |
| JP | 09-246578 | 9/1997 |
| JP | 2000-004036 | 1/2000 |
| JP | 2002-9313 | 1/2002 |
| JP | 2002-16271 | 1/2002 |
| JP | 3377814 | 12/2002 |

* cited by examiner

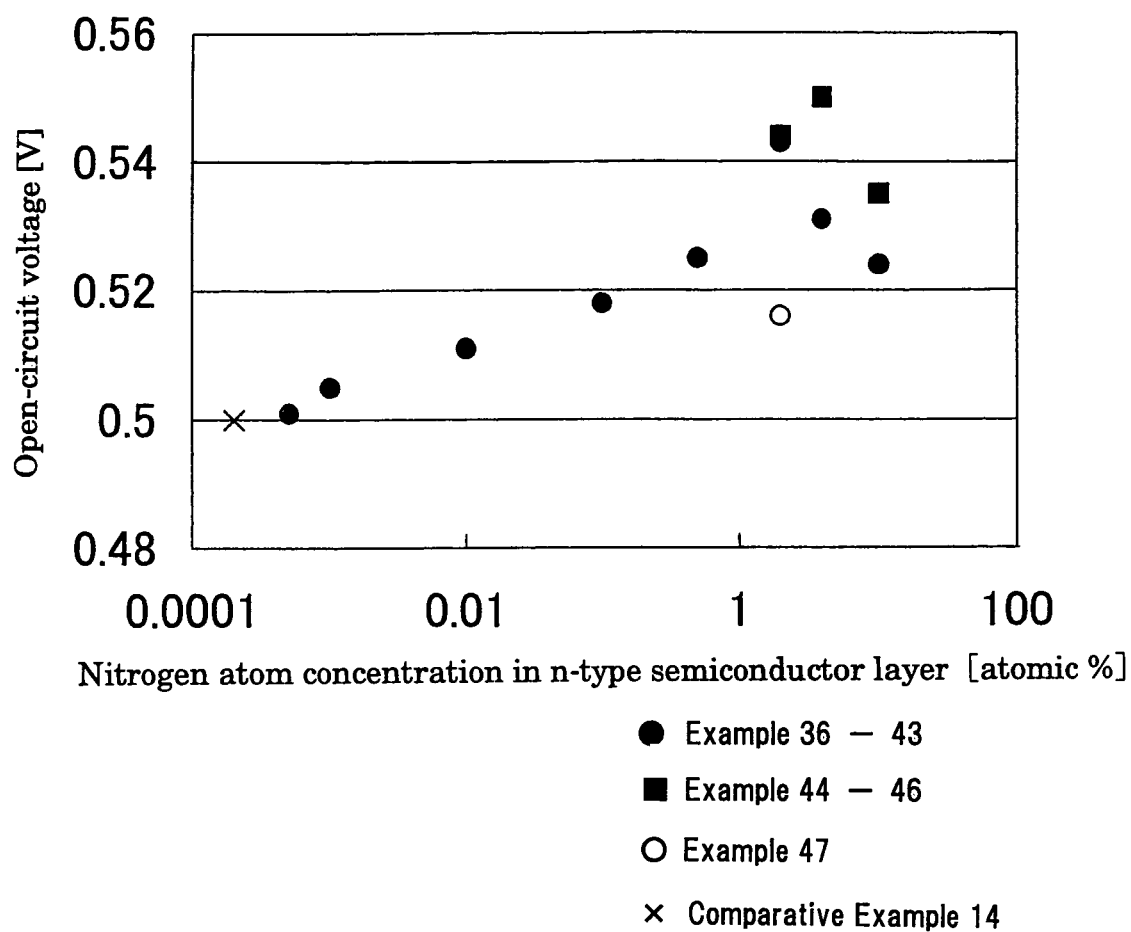

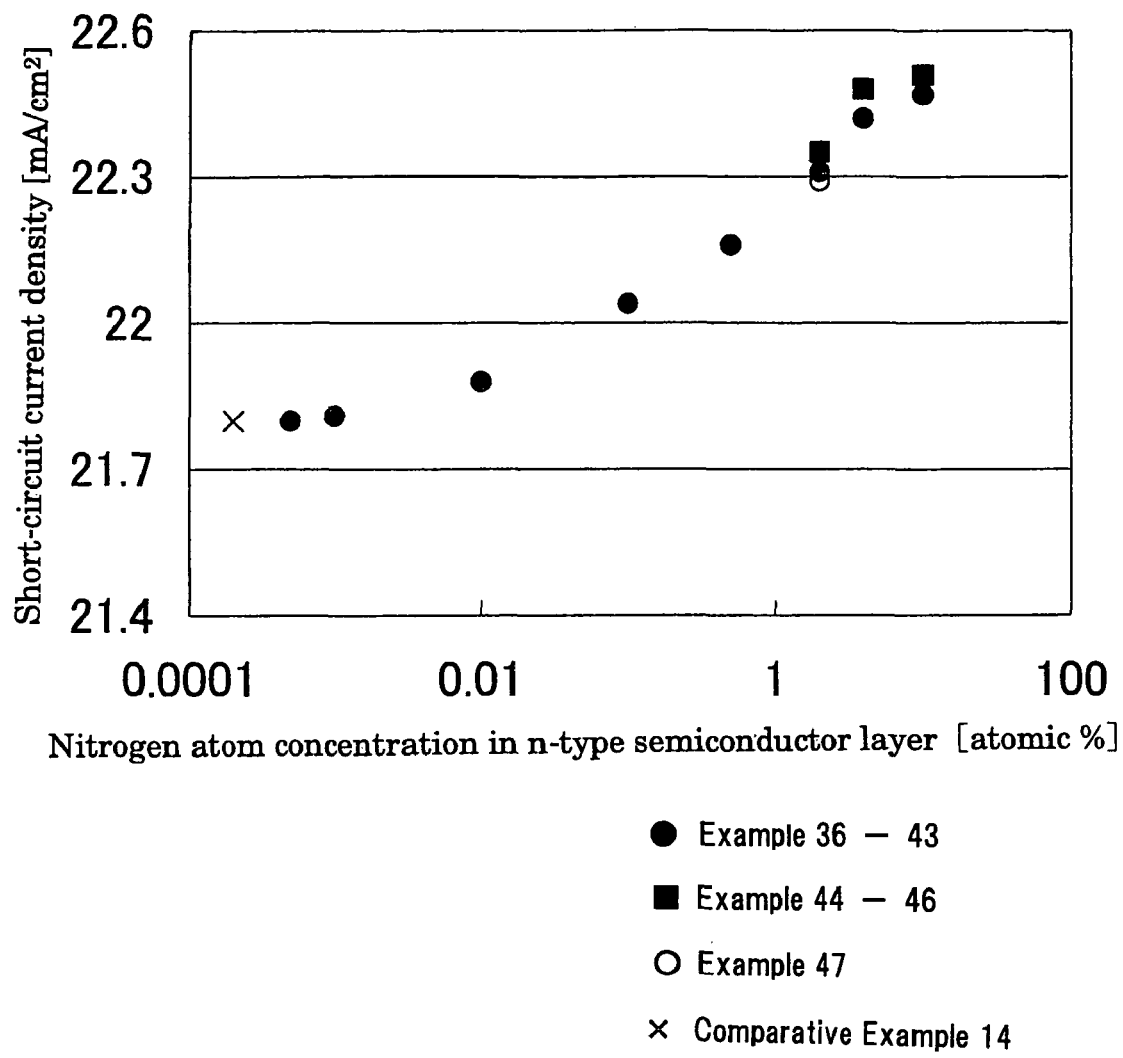

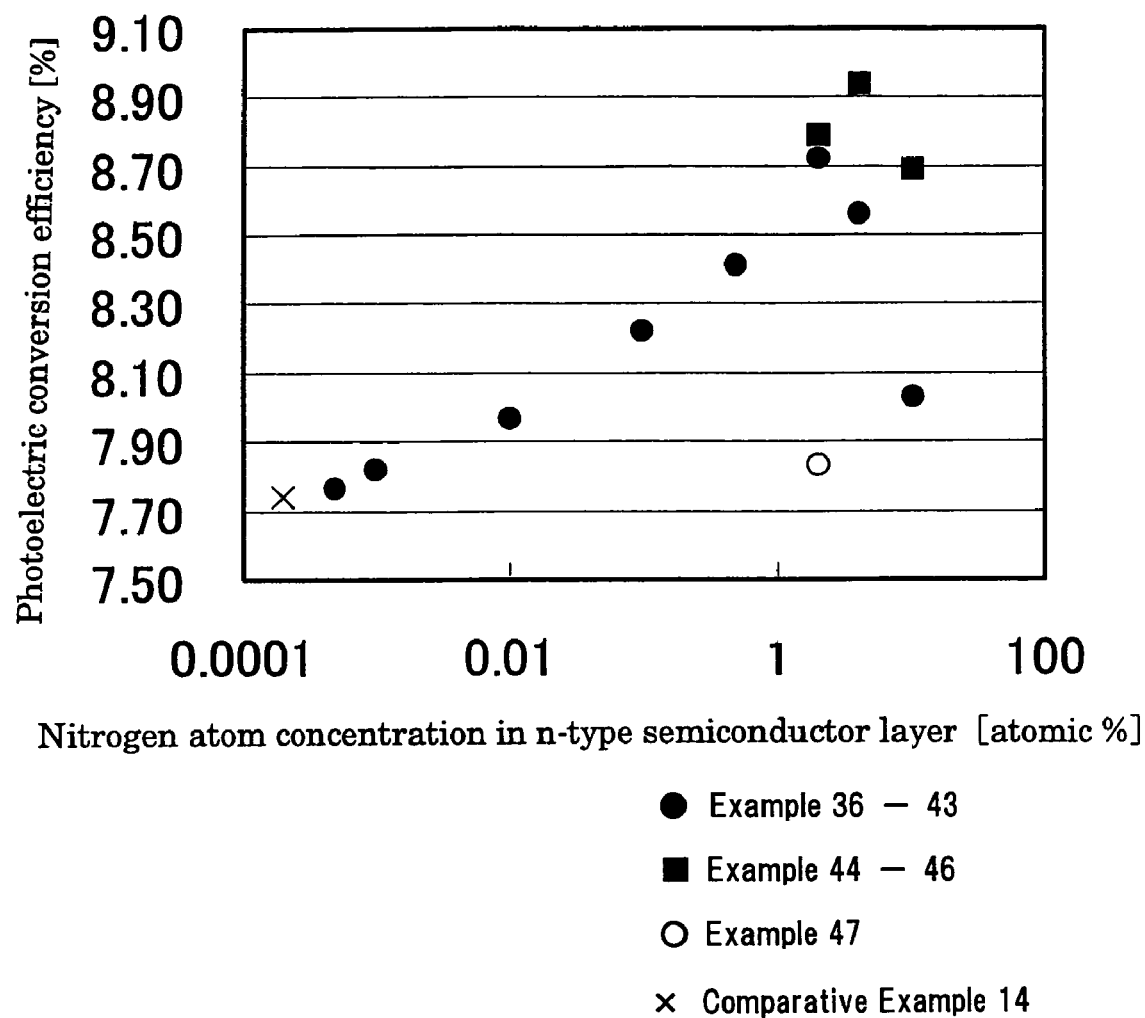

PHOTOELECTRIC CONVERSION DEVICE AND MANUFACTURING METHOD THEREOF

CROSS-REFERENCE TO RELATED APPLICATION

This application is related to Japanese patent applications Nos. 2004-086811, 2004-257181 and 2004-308381, filed on 24 Mar. 2004, 3 Sep. 2004 and 22 Oct. 2004, respectively, whose priorities are claimed under 35 USC §119, the disclosures of which are incorporated by reference in their entirety.

BACKGROUND

1. Field of the Technology

The technology presented herein relates to a photoelectric conversion device and a manufacturing method thereof. More specifically, the technology relates to a photoelectric conversion device with improved photoelectric conversion efficiency and a manufacturing method thereof.

2. Description of the Related Art

Due to a problem with a decrease in quantity of remaining resources, there has been a concern about future supply deficiency in fossil fuels, such as oil, that are utilized as power energy sources. There has also been an issue with carbon dioxide emission that causes global warming. Under such circumstances, solar cells are attracting attention as alternative energy to fossil fuels.

In a typical solar cell, a p-n junction of a semiconductor is applied to a photoelectric conversion layer for converting light energy into electrical energy, and silicon is in the widest use as a raw material for the photoelectric conversion layer. Among solar cells using silicon, the most widely available ones have been solar cells using bulk crystalline silicon, such as monocrystalline silicon and polycrystalline silicon. Recently, prices for solar cell modules are decreasing due solar energy generation system is rapidly becoming widespread.

However, since a bulk-crystal type solar cell is formed using a silicon substrate having a thickness of several hundreds of micrometers, raw material cost forms a large proportion of a price for a solar cell, and it is thus becoming more difficult to significantly reduce the cost of producing the cell. Further, in production of a monocrystalline silicon substrate and a polycrystalline silicon substrate, which are used for the above-mentioned bulk-crystal type solar cell, the silicon needs to be heated at a high temperature of 1500° C. or higher for melting. This has caused a problem with a large volume of carbon dioxide emissions at the time of producing those silicon substrates.

Meanwhile, a technique for thin-film silicon solar cells is under development, as a next generation technique in which a silicon thin film is deposited on a substrate to significantly reduce an amount of silicon used, thus enabling significant reduction in cost as well as volume of carbon dioxide emissions.

A photoelectric conversion layer in the thin-film silicon solar cell is normally formed of a thin film of a semiconductor such as hydrogenated amorphous silicon or hydrogenated microcrystalline silicon. The solar cell formed of hydrogenated microcrystalline silicon is superior to the solar cell formed of hydrogenated amorphous silicon in that no light degradation occurs. Hence the solar cell formed of hydrogenated microcrystalline silicon is currently attracting attention as a thin-film silicon solar cell whose efficiency can further be enhanced.

The term "amorphous" is used in this specification as a synonymous with a term "amorphous" normally used in the field. Further, the term "microscopic crystal" used in this specification means not only a state formed substantially of a crystalline phase alone, but also a state where an amorphous phase and a crystalline phase are mixed. For example, in Raman scattering spectrum, if a sharp peak in the vicinity of 520 $cm^{-1}$, attributed to silicon-silicon bonding in crystalline silicon, is detected even in a trace amount, the silicon in use is regarded as "microscopic crystal silicon". In the same meaning, the term "microscopic crystal silicon" is used in the specification.

Typical thin-film silicon solar cells are classified into two types: a superstrate type and a substrate type. The superstrate type is a type of the thin-film silicon solar cell in a light transmitting conductive film, a photoelectric conversion layer and an electrode are laminated in this order on a light transmitting substrate and in which light is incident on the substrate side. The substrate type is type of the thin-film silicon solar cell in an electrode, a photoelectric conversion layer, a light transmitting conductive film and a grid electrode are laminated in this order on a substrate and in which light is incident on the grid electrode side. In many cases, the photoelectric conversion layer of both the superstrate and substrate types have a pin junction structure comprising a p-type semiconductor layer (p-type conductivity layer), an intrinsic semiconductor layer (i-type conductivity layer) and an n-type semiconductor layer (n-type conductivity layer).

However, since the thin-film silicon solar cell has low photoelectric conversion efficiency per unit area as compared to the bulk-crystal type solar cell, the market for the thin-film silicon solar cell has in reality not expanded like the market for the bulk-crystal type solar cell.

Therefore, enhancing efficiency is an important subject for the thin-film silicon solar cell to become fully widespread. One of means for enhancing efficiency may be widening a band gap of a semiconductor layer (hereinafter referred to as window layer) on a light incident plane side of a solar cell. In the above thin-film silicon solar cell, with the band gap of a window layer widened, a short-circuit current density increases due to a reduction in light absorption loss in the window layer, and an open-circuit voltage increases due to an increase in diffusion potential, thereby making it possible to enhance photoelectric conversion efficiency.

Examples of conventional techniques related to widening of a band gap of a window layer as thus described, include a technique for a thin-film photoelectric conversion device, described in JP-A 2002-016271. According to this thin-film photoelectric conversion device, light absorptions of a p-type semiconductor layer and an n-type semiconductor layer are reduced, and a band gap of an interface is widened, to reduce interface recombination, and thereby high photoelectric conversion efficiency can be obtained.

Examples of the conventional techniques further include, as a similar technique to the technique of JP-A 2002-016271, a technique for a polycrystalline silicon thin film described in Japanese Patent No. 3377814. This polycrystalline silicon thin film is obtained by forming a silicon film on a substrate where the nucleus of microcrystalline silicon has been formed. The nucleus of microcrystalline silicon is made out of a thin-film of a-SiC:H or a-SiN:H formed on the substrate.

The technique of JP-A 2002-016271 is to widen a band gap of a p-type semiconductor layer for enhancing efficiency. Meanwhile, a similar effect to this technique can be expected by widening a band gap of an n-type semiconductor layer, which is described in JP-A 2002-009313. In a pin-junction type thin-film solar cell formed by laminating a plurality of semiconductor layers, the solar cell is characterized by having a pin-structure which is mainly composed of amorphous silicon and whose n-type semiconductor layer has a band gap made wider than that of an i-type semiconductor layer, to contain a trace amount of n-type impurity in the i-type semiconductor layer.

In the technique of JP-A 2002-016271, when carbon is used as an added element for widening of a band gap, it is required to contain carbon in a large amount, not less than 10 atomic %, in a silicon film. However, this involves a simultaneous increase in uncombined silicon in the film. In other words, addition of an impurity at a high concentration of not lower than 10 atomic % leads to an increase in density of uncombined silicon formed in the film as compared to the case of a low-concentration impurity. Since the conductivity decreases with increase in defect density of the semiconductor layer, a fill factor of a solar cell might decrease. Further, it is known that, when a conductivity type determination element to be doped in a p-type semiconductor layer or an n-type semiconductor layer is activated in the film as a dopant, the activation efficiency of the element decreases with increase in concentration of carbon as the impurity element in the film. Hence, higher concentration of the impurity added, a carrier concentration decreases. Moreover, the lower the concentration of the impurity element in the film, the more crystallization tends to be enhanced, and under the above-mentioned high-concentration condition, a proportion of an amorphous phase in the p-type semiconductor layer or n-type semiconductor layer may increase.

In the technique of Japanese Patent No. 3377814, a thin film of a-SiC:H or a-SiN:H, containing microcrystalline silicon, is first formed on a substrate, the thin film is then removed by etching while remaining microcrystalline silicon alone, the nucleus of microcrystalline silicon is made to be exposed to the surface of the substrate, on which a silicon thin film is deposited again, to form a polycrystalline silicon thin film having a large particle size. Since the initially formed film of a-SiC:H or a-SiN:H is removed, leaving the nucleus of microcrystalline silicon, there may be some effect by widening of a band gap with carbon atoms and nitrogen atoms. However, the above effect is not exerted throughout the ultimately obtained polycrystalline silicon thin film. Namely, the foregoing effects of reduction in light absorption loss and improvement of an open-circuit voltage, produced by widening of a gap band, cannot be expected.

In the technique of JP-A 2002-009313, when an i-type semiconductor layer does not contain, especially, an n-type impurity, and thus an internal electric field is thus not weakened at an i/n interface, a material for widening of a band gap is used or an n-layer. However, widening of the band gap of the n-type semiconductor layer has not been able to bring about production of an equivalent effect of improving photoelectric conversion efficiency to the effect achieved by widening the band gap of the p-type semiconductor layer.

SUMMARY

It has been found that, by containing nitrogen atoms in a p-type or an n-type semiconductor layer in the above-mentioned pin-type photoelectric conversion layer, high photoelectric conversion efficiency can be obtained as compared to the case of containing no nitrogen atom in the either layer.

According to an example embodiment, there is provided a photoelectric conversion device comprising: a pin-type photoelectric conversion layer constituted of a p-type semiconductor layer, an i-type semiconductor layer and an n-type semiconductor layer, wherein the p-type semiconductor layer contains silicon atoms and nitrogen atoms. There is also provided a photoelectric conversion device comprising: a pin-type photoelectric conversion layer constituted of a p-type semiconductor layer, an i-type semiconductor layer and an n-type semiconductor layer, wherein the n-type semiconductor layer contains silicon atoms and nitrogen atoms.

According to another aspect of an example embodiment, there is provided a manufacturing method of a photoelectric conversion device comprising the steps of: forming a conductive film on a substrate and forming a photoelectric conversion layer on the conductive film, the photoelectric conversion layer being constituted of a p-type semiconductor layer, an i-type semiconductor layer and an n-type semiconductor layer, wherein the p-type semiconductor layer is formed using a raw material gas containing silicon atoms, an p-type conductive element and nitrogen atoms so that the p-type semiconductor layer contains the nitrogen atoms at a concentration of 0.001 to 10 atomic %. There is also a manufacturing method of a photoelectric conversion device comprising the steps of: forming a conductive film on a substrate and forming a photoelectric conversion layer on the conductive film, the photoelectric conversion layer being constituted of a p-type semiconductor layer, an i-type semiconductor layer and a n-type semiconductor layer, wherein the n-type semiconductor layer is formed using a raw material gas containing silicon atoms, an n-type conductive element and nitrogen atoms so that the n-type semiconductor layer contains nitrogen atoms at a concentration of 0.001 to 10 atomic %.

According to the photoelectric conversion device of an example embodiment, an open-circuit voltage and a short-circuit current are increased by containing nitrogen atoms, especially at a concentration of 0.001 to 10 atomic %, in a p-type semiconductor layer or an n-type semiconductor layer of a window layer on a light incident side, without containing a high-concentration impurity element in the p-type or n-type semiconductor layer, and thereby it is possible to improve photoelectric conversion efficiency, and further to enhance efficiency of a thin-film silicon solar cell.

Further, according to the manufacturing method of a photoelectric conversion device, it is possible to manufacture a photoelectric conversion device with high photoelectric conversion efficiency while significantly reducing input energy, as compared to a method for manufacturing a bulk-crystal type solar cell, thereby significantly suppressing a volume of carbon dioxide emissions during manufacturing.

These and other features of the present application will become more readily apparent from the detailed description given hereinafter. However, it should be understood that the detailed description and specific examples, while indicating preferred embodiments, are given by way of illustration only, since various changes and modifications within the spirit and scope of the example embodiment will become apparent to those skilled in the art from this detailed description.

BRIEF DESCRIPTION OF THE DRAWINGS

FIG. 6 is a graph showing dependency of an open-circuit voltage on a nitrogen atom concentration in an n-type semiconductor layer in Examples 36 to 47 and Comparative Example 14;

FIG. 7 is a graph showing dependency of a short-circuit current density on the nitrogen atom concentration in the n-type semiconductor layer in Examples 36 to 47 and Comparative Example 14; and FIG. 8 is a graph showing dependency of photoelectric conversion efficiency on the nitrogen atom concentration in the n-type semiconductor layer in Examples 36 to 47 and Comparative Example 14.

DETAILED DESCRIPTION OF THE PREFERRED EMBODIMENTS

Figure 1:
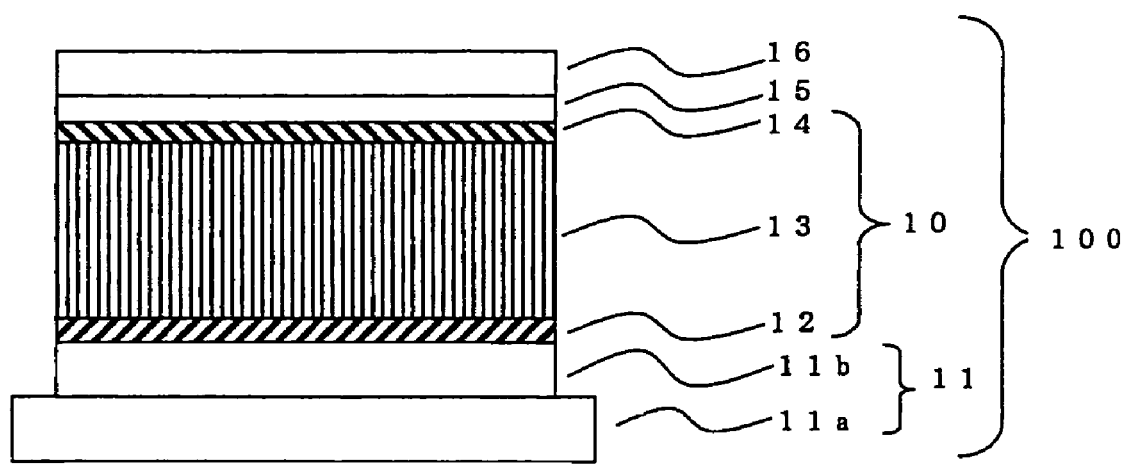
FIG. 1 is a cross-sectional view schematically showing a superstrate type photoelectric conversion device of Embodiment 1.

A photoelectric conversion device of an example embodiment presented herein can adopt a conventionally known superstrate type structure and substrate type structure, and can also adopt a conventionally known superstrate laminated type structure and substrate laminated type structure, which are constituted by lamination of a plurality of photoelectric conversion layers. The superstrate type structure can be constituted by sequentially laminating a light transmitting substrate, a light transmitting conductive film, a photoelectric conversion layer, a conductive film and an electrode. Further, the substrate type structure can be constituted by sequentially laminating a substrate, a conductive film, a photoelectric conversion layer, a light transmitting conductive film and an electrode having been patterned so as to transmit light.

Below described is a photoelectric conversion layer which characterizes the example embodiment.

In the photoelectric conversion device of the example embodiment, the photoelectric conversion layers have the following basic structures (A), (B), (C), and (D):

(A) A photoelectric conversion device comprising: at least one pin-type photoelectric conversion layer constituted by laminating a p-type semiconductor layer containing silicon atoms, an i-type semiconductor layer and an n-type semiconductor layer, wherein the p-type semiconductor layer contains nitrogen atoms;

(B) A photoelectric conversion device comprising: at least one pin-type photoelectric conversion layer constituted by laminating first and second p-type semiconductor layers containing silicon atoms, an i-type semiconductor layer and an n-type semiconductor layer, wherein the first p-type semiconductor layer contains nitrogen atoms, and the second p-type semiconductor layer, adjacent to the i-type semiconductor layer, has a crystalline silicon phase;

(C) A photoelectric conversion device comprising: at least one pin-type photoelectric conversion layer constituted by laminating a p-type semiconductor layer, an i-type semiconductor layer and an n-type semiconductor layer containing silicon atoms, wherein the n-type semiconductor layer contains nitrogen atoms;

(D) A photoelectric conversion device comprising: at least one pin-type photoelectric conversion layer constituted by laminating a p-type semiconductor layer, an i-type semiconductor layer, and first and second n-type semiconductor layers containing silicon atoms, wherein the first n-type semiconductor layer, adjacent to the i-type semiconductor layer, has a crystalline silicon phase, and the second n-type semiconductor layer contains nitrogen atoms.

In the following, the photoelectric conversion devices having the above-mentioned structures A to D are described.
Photoelectric Conversion Device with the Structure A (A1) In order to increase an open-circuit voltage, the nitrogen atom concentration in the p-type semiconductor layer is preferably from 0.001 to 10 atomic %. The nitrogen atom concentration in the p-type semiconductor layer is more preferably from 0.01 to 10 atomic %. In such an arrangement, the open-circuit voltage is increased, and additionally, a light transmisivity of the p-type semiconductor layer improves to produce the effect of increasing a short-circuit current in the photoelectric conversion device, thereby further improving photoelectric conversion efficiency.

(A2) It is further preferable that the p-type semiconductor layer contain boron atoms as a p-type doping element, together with nitrogen atoms, and that the relationship of the nitrogen atom concentration A (atomic %) and the boron atom concentration B (atomic %), is expressed by the formula: $0.11-0.009A+0.042A^2 \leq B \leq 0.2+0.2A+0.05A^2$ (Relational formula 1). In such an arrangement, the carrier concentration and a proportion of the crystalline phase can be kept sufficiently high even when high-concentration nitrogen atoms are added, thereby leading to increases in open-circuit voltage and short-circuit current, and it is thus possible to improve photoelectric conversion efficiency, thereby to attempt to enhance efficiency of the cell. In this case, the nitrogen atom concentration in the p-type semiconductor layer containing nitrogen atoms and boron atoms is preferably from 0.01 to 15 atomic %, and more preferably from 4 to 15 atomic %. It is to be noted that the p-type semiconductor layer may contain aluminum, gallium or indium as a p-type doping element instead of boron.

Further, in this case, the p-type semiconductor layer containing nitrogen atoms and boron atoms preferably has no absorption peak in the wavelength range of 1,800 to 1,950 $cm^{-1}$ in a measured phonon spectrum. In such an arrangement, the carrier concentration becomes high, leading to improvement of photoelectric conversion efficiency.

(A3) It is further preferable that the p-type semiconductor layer containing nitrogen atoms contains silicon atoms as a crystalline silicon phase. In other words, the p-type semiconductor layer may be a microcrystalline silicon layer containing nitrogen atoms. With the microcrystalline silicon layer used as the p-type semiconductor layer, the conductivity of the p-type semiconductor layer improves more as compared to an amorphous silicon layer as the p-type semiconductor layer, to reduce series resistance, resulting in an increase in fill factor of the photoelectric conversion device, and thereby high photoelectric conversion efficiency can be obtained.

In this case, in the p-type semiconductor layer containing nitrogen atoms, an intensity ratio (Ic/Ia) of a peak height of the crystalline silicon phase Ic to a peak height of an amorphous silicon phase Ia of crystalline volume Fraction in a measured spectrum of Raman scattering spectroscopy is preferably not less than 3.

(A4) The n-type semiconductor layer is not particularly restricted, and may for example be a layer of silicon or other kinds of semiconductors that contains the n-type doping element. However, it is preferable that the n-type semiconductor layer further contain nitrogen atoms, so as to further increase an open-circuit voltage and short-circuit current, thereby improving photoelectric conversion efficiency.

(A5) Although the i-type semiconductor layer is not particularly restricted, it may further preferably contain the silicon atoms as the crystalline silicon phase. In other words, the i-type semiconductor layer may be a microcrystalline silicon layer. In such an arrangement, an i-type semiconductor layer free from photo-degradation can be obtained. Furthermore, in the case where the p-type semiconductor layer and the i-type semiconductor layer are both made of microcrystalline silicon, a homojunction is formed between those layers, which can enhance the effect of suppressing recombination at the p/i layer interface, resulting in an increase in fill factor of the photoelectric conversion device, and therefore even higher photoelectric conversion efficiency can be obtained.

(A6) The photoelectric conversion device may have a superstrate structure in which light is incident from the substrate side, or a substrate type structure in which light is incident from the opposite side to the substrate, namely the side of a grid electrode having been patterned to transmit light. Further, the photoelectric conversion device may be a superstrate laminated type photoelectric conversion device or a substrate laminated type photoelectric conversion device comprising not less than two pin-type photoelectric conversion layers. Further, a laminated photoelectric conversion device may comprise three or more photoelectric conversion layers.

Photoelectric Conversion Device with the Structure B (B1) It is preferable that the first p-type semiconductor layer preferably have nitrogen atoms concentration of 0.5 to 10 atomic %, and more preferably contain a crystalline silicon phase. In other words, the first p-type semiconductor layer may be a microcrystalline silicon layer containing nitrogen atoms. With the microcrystalline silicon layer used as the first p-type semiconductor layer, the conductivity of the p-type semiconductor layer improves more as compared to the amorphous silicon layer as the p-type semiconductor layer, to reduce series resistance, resulting in an increase in fill factor of the photoelectric conversion device, and thereby high photoelectric conversion efficiency can be obtained.

(B2) The second p-type semiconductor layer may be a microcrystalline silicon. In the presence of this second p-type semiconductor layer, it is possible to reduce recombination of photoproduction carriers, which is formed due to the discontinuity of the band gap of the p/i layer interface that occurs associated with widening of the band gap of the first p-type semiconductor layer, thereby enabling improvement of photoelectric conversion efficiency.

(B3) As in (A2) above, the first p-type semiconductor layer containing nitrogen atoms may be constituted such that it contains boron atoms as the p-type doping element, and that the nitrogen atom concentration A (atomic %) and the boron atom concentration B (atomic %), are expressed by the formula: $0.11-0.009A+0.0422 \leqq B \leqq 0.2+0.2A+0.05A^2$ (Relational formula 1). In this case, the nitrogen atom concentration is preferably from 0.01 to 15 atomic %, and more preferably from 4 to 15 atomic %.

(B4) The same arrangements as those in (A4) to (A6) above may be made.

Photoelectric Conversion Device with the Structure C (C1) In order to increase an open-circuit voltage, the nitrogen atom concentration in the n-type semiconductor layer is preferably from 0.001 to 10 atomic %. The nitrogen atom concentration in the n-type semiconductor layer is more preferably from 0.01 to 10 atomic %. In such an arrangement, the open-circuit voltage is increased, and additionally, a light transmissivity of the n-type semiconductor layer improves to produce the effect of increasing a short-circuit current in the photoelectric conversion device, thereby farther improving photoelectric conversion efficiency.

(C2) It is further preferable that the n-type semiconductor layer containing nitrogen atoms contains a crystalline silicon phase. In other words, the n-type semiconductor layer may be a microcrystalline silicon layer containing nitrogen atoms. With the microcrystalline silicon layer used as the n-type semiconductor layer, the conductivity of the n-type semiconductor layer improves more as compared to the amorphous silicon layer as the n-type semiconductor layer, to reduce series resistance, resulting in an increase in fill factor of the photoelectric conversion device, and thereby high photoelectric conversion efficiency can be obtained.

In this case, it is preferable to set an intensity ratio (Ic/Ia) of a peak height of the crystalline silicon phase Ic to a peak height of an amorphous silicon phase Ia of crystalline volume fraction in a measured spectrum of Raman scattering spectroscopy of the n-type semiconductor layer to not less than 3, so as to form a favorable junction with the i-type semiconductor layer, and thereby high photoelectric conversion efficiency can be obtained.

(C3) The p-type semiconductor layer is not particularly restricted, and may for example be a layer of silicon or other kinds of semiconductors that contains the p-type doping element. However, it is preferable that the p-type semiconductor layer further contain carbon atoms and/or nitrogen atoms. With those atoms contained in the p-type semiconductor layer, it is possible to obtain the effect of increasing the open-circuit voltage and short-circuit current.

(C4) The same arrangements as those in (A5) and (A6) above may be made.

Photoelectric Conversion Device with the Structure D (D1) The first n-type semiconductor layer containing nitrogen atoms may be a microcrystalline silicon layer. In the presence of this first n-type semiconductor layer, it is possible to reduce recombination of photoproduction carriers, which is formed due to the discontinuity of the band gap of the i/n layer interface that occurs associated with widening of the band gap of the second n-type semiconductor layer, thereby enabling improvement of photoelectric conversion efficiency.

(D2) The second n-type semiconductor layer preferably has a nitrogen atom concentration of 4 to 10 atomic %. In this case, the second n-type semiconductor layer further preferably contains silicon atoms as a crystalline silicon phase. In other words, the second n-type semiconductor layer may be a microcrystalline silicon layer containing nitrogen atoms. With the microcrystalline silicon layer used as the second n-type semiconductor layer, the conductivity of the n-type semiconductor layer improves more as compared to the amorphous silicon layer as the n-type semiconductor layer, to reduce series resistance, resulting in an increase in fill factor of the photoelectric conversion device, and thereby high photoelectric conversion efficiency can be obtained.

Further, in this case, it is preferable to set an intensity ratio of crystalline volume fraction in a measured spectrum of Raman scattering spectroscopy of the second n-type semiconductor layer to not less than 3, so as to form a favorable junction with the first n-type semiconductor layer, and thereby high photoelectric conversion efficiency can be obtained.

(D3) The same arrangements as those in (C3), (A5) and (A6) above may be made.

In the following, embodiments of the photoelectric conversion device are described in detail, based on drawings. However, the technology presented herein is not restricted to those embodiments. For example, a photoelectric conversion device may be obtained by placing a p-type semiconductor layer of the present invention onto an n-type semiconductor layer constituted of a bulk crystal. Further, a photoelectric conversion device may be obtained by laminating the n-type semiconductor layer constituted of a bulk crystal, an i-type semiconductor layer, and the p-type semiconductor layer of the present invention, in this order. When a bulk crystal is used for an n-type semiconductor layer, the effect of reducing input energy and the effect of suppressing carbon dioxide emission become small as compared to the case where a thin film is used for the n-type semiconductor layer. However, it is possible to reduce input energy and suppress carbon dioxide emission by a technique where the p-type semiconductor layer of the present invention, whose junction can be formed in a process performed at low temperature and taking a short period of time, is applied to a bulk-crystal type solar cell, as compared to a conventional technique for producing a bulk-crystal type solar cell where a junction is formed by a heat diffusion method which is performed at high temperature and takes a long period of time. Simultaneously with the above-mentioned attempts, it is possible to improve photoelectric conversion efficiency.

For the same reason, a photoelectric conversion device may be obtained by placing an n-type semiconductor layer on a p-type semiconductor layer constituted of a bulk crystal. Further, a photoelectric conversion device may be obtained by laminating the p-type semiconductor layer constituted of a bulk crystal, an i-type semiconductor layer, and the n-type semiconductor layer of the present invention, in this order.

Embodiment 1

As shown in FIG. 1, a photoelectric conversion device 100 of Embodiment 1 has a superstrate type structure and is constituted by laminating, on a substrate 11, a photoelectric conversion layer 10, a transparent conductive layer 15, and an electrode 16, in this order.

<Description of Substrate>

The substrate 11 is produced by depositing, for example, a transparent conductive layer 11b on a light permeable substrate 11a. As the light permeable substrate 11a, a glass plate, a heat-resistant translucent plate of a resin such as polyimide or polyvinyl, or a lamination of those is preferably used. The light permeable substrate 11a is however not particularly restricted, as long as it has high translucency and can structurally support the entire photoelectric conversion device. The light permeable substrate 11a may also be produced by covering the above-mentioned plates with a light permeable metal film, a transparent conductive film, an insulating film, or the like. However, in the case of applying the photoelectric conversion device to the substrate type structure, the light permeable substrate 11a may be substituted by a non-transparent substrate such as stainless.

The transparent conductive layer 11b is made of a transparent conductive material. For example, a single or plural layered transparent conductive film made of ITO, tin oxide, zinc oxide, or the like, can be used. Since the transparent conductive layer 11b serves as an electrode, it preferably has high electric conductivity, and a material whose electric conductivity has been improved by addition of a trace amount of impurity thereto may also be used. As a method for forming the transparent conductive layer 11b, there may be cited known methods such as sputtering, chemical vapor deposition (CVD), electron beam evaporation, sol-gel processing, spraying, and electrocrystallization. Further, irregularities are desirably formed on the surface of the transparent conductive layer 11b. With those irregularities, an incident light, incident from the light permeable substrate 11a side, can be scattered and refracted to extend its optical length, which enhances the effect of trapping light in the photoelectric conversion layer 10 so that improvement of a short-circuit current can be expected. Examples of a method for forming irregularities on the surface of the transparent conductive layer 11b may include: a method comprising depositing the transparent conductive layer 11b on the light permeable substrate 11a, and forming irregularities on the deposited transparent conductive layer 11b by etching or machining, such as sandblasting; a method of using irregularities on the surface of the transparent conductive layer 11b which have been formed by crystal growth of a film material during formation; and a method of using irregularities on the surface of the transparent conductive layer 11b which have been regularly formed because a crystal growth surface is oriented. In the present embodiment, as the substrate 11, a substrate (product name "Asahi-U", manufactured by ASAHI GLASS CO., LTD.) formed by depositing a tin oxide layer on a white glass plate by CVD was used, which is a substrate obtained by the method of using irregularities having been formed at the time of crystal growth of a layer material. Further, it is preferable to deposit a zinc oxide layer on the substrate 11 by sputtering, so as to prevent the tin oxide layer from being damaged by plasma when a photoelectric conversion layer is later formed.

<Description of Photoelectric Conversion Layer>

The photoelectric conversion layer 10 is mainly composed of silicon, and in particular, amorphous silicon, microcrystalline silicon, or the like is preferably used. As described above, in the present invention, the terms "amorphous silicon" and "microcrystalline silicon" respectively include "hydrogenated amorphous silicon" and "hydrogenated microcrystalline silicon" which are generally used in the field. The photoelectric conversion layer 10 of the present embodiment is formed by laminating, from the substrate 11 side, a p-type semiconductor layer 12, an i-type semiconductor layer 13 and an n-type semiconductor layer 14, in this order, to have a pin junction structure. The thicknesses of the respective layers are not particularly restricted. Meanwhile, the thickness of the p-type semiconductor layer 12 may be in the range from 5 to 50 nm, and is preferably from 10 to 30 nm. The thickness of the i-type semiconductor layer 13 may be in the range from 100 to 5,000 nm, and is preferably from 200 to 4,000 nm. The thickness of the n-type semiconductor layer 14 may be in the range from 5 to 100 nm, and is preferably from 10 to 30 n.

(P-Type Semiconductor Layer)

The p-type semiconductor layer 12 is formed by adding nitrogen atoms to a microcrystalline silicon layer with, preferably, boron doped therein as the p-type doping element. Herein, the microcrystalline silicon layer means a semiconductor layer made of a mixed phase of an amorphous phase and a microcrystalline phase formed at low temperature using a nonequilibrium process such as plasma CVD. As the p-type doping element, impurity atoms, such as boron, aluminum, gallium or indium, can be used. Among those impurities, boron is most preferably used, from the viewpoint that high-concentration doping is possible since a solid solubility of boron in silicon is large, and handling is easy when the silicon layer is produced by the most commonly used plasma CVD.

With nitrogen atoms contained in the p-type semiconductor layer 12, an open-circuit voltage increases. The following are among those considered as the reasons for this: (1) a band gap of the p-type semiconductor layer widens and a diffusion potential thus increases; and (2) the effect of passivation of a crystal grain boundary interface as well as passivation of a p/i layer interface is produced by containing nitrogen atoms, to reduce the interface recombination. The effect of (2) above is considered similar to the surface passivation effect by a silicon nitride film, which is generally used for crystalline silicon solar cells, namely the effect of suppressing surface recombination of photoproduction carriers at the silicon substrate surface.

Although the amorphous silicon layer can be used as a mother layer of the p-type semiconductor layer 12 in place of the above-mentioned microcrystalline silicon, the crystalline silicon phase is desirably contained, in light of obtaining high conductivity to reduce series resistance of a photoelectric conversion layer. Namely, it is desirable to use a microcrystalline silicon layer with nitrogen atoms added, so as to increase the fill factor, and thereby high photoelectric conversion efficiency can be obtained. Further, an intensity ratio of crystalline volume fraction in a measured spectrum of Raman scattering spectroscopy of the p-type semiconductor layer 12 is preferably not less than 3. Herein, the intensity ratio is a ratio (Ic/Ia) of a peak height (Ic) of 520 cm$^{-1}$ attributed to a silicon-silicon bonding to a peak height (Ia) of amorphous silicon of 480 cm$^{-1}$, in Raman scattering spectrum of a single p-type semiconductor layer. Although not expressing an absolute value of a crystalline volume fraction, the ratio (Ic/Ia) is in general use in the field as an indicator of a ratio of a crystallized element in a film since the ratio well reflects the crystalline volume fraction. With the intensity ratio of crystalline volume fraction in a measured spectrum of Raman scattering spectroscopy of the p-type semiconductor layer 12 being not less than 3, the p-type semiconductor layer 12 has a sufficiently high intensity ratio as a base layer of the later-mentioned i-type semiconductor layer 13. Hence crystal elements tend to grow under the influence of the base layer in the initial stage of depositing the i-type semiconductor layer, resulting in production of a high-quality i-type semiconductor layer 13 having a high intensity ratio, and it is thus possible to increase a short-circuit current density, thereby to obtain high photoelectric conversion efficiency. On the contrary, with the intensity ratio of the p-type semiconductor layer 12 being less than 3, due to the low intensity ratio, it is hard to obtain a high-quality i-type semiconductor layer 13 having a high intensity ratio, and hence a short-circuit current density tends to be decreased, thereby to reduce photoelectric conversion efficiency. Further, it is preferable to set a production temperature at low temperature (200° C. or lower), so as to selectively remove the amorphous phase which is easily etched to improve an etching effect by hydrogen radicals, resulting in formation of a semiconductor layer comprising many crystalline phases, and thereby photoelectric conversion efficiency can be improved.

As described above, setting of a high hydrogen dilution ratio or low-temperature formation of the p-type semiconductor layer 12 are effective for realizing a state in which the p-type semiconductor layer 12 has a high intensity ratio of crystalline volume fraction in a measured spectrum of Raman scattering spectroscopy. However, the realization of such a state is accompanied with inactivation of the p-type doping element (B, Ga, Al, etc.) by hydrogen, thereby reducing the effect of activation of the p-type doping element. The reason for this is known to be that, although the p-type doping element acts as an acceptor in a crystal silicon by being bonded with silicon by 4-coordination, when hydrogen is inserted into one bonding of silicon and the p-type doping element, the p-type doping element becomes bonded by 3-coordination to be electrically inactivated. It is therefore possible to improve photoelectric conversion characteristics by reactivation of the inactivated p-type doping element, under the production conditions used for enhancing the intensity ratio of the p-type semiconductor layer 12. Below, such a method is specifically described.

It is known that, when the p-type doping element has been inactivated by hydrogen, a sharp peak attributed to the above-mentioned bonding of the crystalline silicon and the p-type doping element in a wavelength range of 1,800 to 1,950 cm$^{-1}$ in a measured phonon spectrum (by Raman scattering spectroscopy or infrared absorption spectroscopy). Especially in the case where the p-type doping element is boron, a peak is observed in the vicinity of about 1,875 cm$^{-1}$. It was found that in such a case, the p-type semiconductor layer after formation is heat-treated at 180 to 350° C. to release hydrogen having inactivated the p-type doping element, thereby eliminating a peak attributed to the bonding of the crystalline silicon and the p-type doping element, and also increasing the carrier concentration by about an order of magnitude. It is therefore preferable that the p-type semiconductor layer 12 have no peak in the wavelength range of 1,800 to 1,950 cm$^{-1}$ in a measured phonon spectrum (i.e. the p-type doping element has not been inactivated by hydrogen), for increasing the carrier concentration to improve the photoelectric conversion efficiency, and it is effective to heat-treat the p-type semiconductor layer after formation at 180 to 350° C. This temperature range is desirable because hydrogen is sufficiently released in heat treatment at a temperature not lower than 180° C., and diffusion of an impurity element on a junction interface is suppressed in heat treatment at a temperature not higher than 350° C., thereby preventing deterioration in characteristics of the photoelectric conversion device.

It is preferable that the p-type semiconductor layer 12 contain nitrogen atoms at a concentration of 0.001 to 10 atomic %. In this arrangement, the open-circuit voltage is increased, and thereby high photoelectric conversion efficiency can be obtained, as compared to the p-type semiconductor layer containing no nitrogen atom. Herein, the nitrogen atom concentration is a value obtained by high sensitive secondary ion mass spectrometry (SIMS) or Auger electron spectroscopy.

It is further preferable that the p-type semiconductor layer 12 contain nitrogen atoms at a concentration of 0.01 to 10 atomic %. In this arrangement, in addition to improvement of the open-circuit voltage, a light transmittance is improved to increase a short-circuit current density, thereby farther improving photoelectric conversion efficiency. Moreover, when nitrogen atoms as the impurity element are added to the p-type semiconductor layer 12 as described above, it is possible to obtain the effect of improving the open-circuit voltage, with the impurity contained at a low concentration of not higher than 10 atomic %, as compared to the case of adding carbon atoms as in the conventional technique (JP-A 2002-016271). Therefore, on the top of the effects of (1) and (2) above, the following effects can also be expected, taking advantage of the low-concentration impurity: (3) an increase in defect density and an increase in ratio of the amorphous phase in the p-type semiconductor layer, caused by the addition of the impurity, can be suppressed; (4) a decrease in activation efficiency of the p-type doping element, caused by the addition of the impurity, can be suppressed; and (5) with no carbon atom in use, carbon dioxide emission does not increase during the production.

When the nitrogen atom concentration exceeds the above-mentioned concentration range, the effects of (3) and (4) above are reduced, and thereby the photoelectric conversion efficiency might be lowered.

In the present invention, in the case where the nitrogen atom concentration exceeds the above-mentioned range, the p-type semiconductor layer 12 is formed such that the nitrogen atom concentration A and the boron atom concentration B have a correlation expressed by Relational formula 1: 0.11–

$0.009A+0.042A^2 \leq B \leq 0.2+0.2A+0.05A^2$, allowing realization of a sufficient carrier concentration even when the activation efficiency of the p-type doping element is low, and thereby characteristics of the photoelectric conversion device can be improved. When above Relational formula 1 is satisfied, the nitrogen atom concentration, is preferably from 0.01 to 15 atomic %, and more preferably from 4 to 15 atomic %. In this case, a suitable crystalline volume fraction can be achieved by increasing a gas flow rate ratio ($[H_2]/[SiH_4]$) in a raw material gas within a range of 120 to 900, and/or by setting the production temperature at low temperature (200° C. or lower), and thereby characteristics of the photoelectric conversion device can be improved. The reason for this is as follows. It is experimentally known that atomic hydrogen (hydrogen radical) plays an important role for forming a crystalline phase at low temperature, and an amount of hydrogen radicals on the growth surface of a semiconductor layer can be increased by increasing the gas flow rate ratio ($[H_2]/[SiH_4]$). Herein, with the gas flow rate ratio ($[H_2]/[SiH_4]$) being not more than 120, a sufficiently high crystalline volume fraction cannot be achieved. With the gas flow rate ratio ($[H_2]/[SiH_4]$) being not less than 900, amounts (about 100 times as large as a hydrogen amount) of dilution gases ($N_2$, Ar) to be used for safety increase along with an increase in amount of the raw material gas, thereby increasing cost, which is not desirable.

It is further preferable that the p-type semiconductor layer 12 have a first p-type semiconductor layer which is made of amorphous silicon or microcrystalline silicon and with nitrogen atoms added, and a second p-type semiconductor layer which is made of microcrystalline silicon and not actively with nitrogen atoms added. In this case, the nitrogen atom concentration in the first p-type semiconductor layer can be from 0.5 to 10 atomic %, and is preferably from 0.5 to 8 atomic %. On the other hand, the second p-type semiconductor layer contains almost no nitrogen atom since a raw material gas containing nitrogen atoms is not used during formation of the second p-type semiconductor layer. However, during the formation, nitrogen atoms may be contained in such a trace amount as to be naturally taken into the layer due to degassing or the presence of a remaining gas in a vacuum chamber and etching of the first p-type semiconductor layer surface. By constituting the p-type semiconductor layer 12 of the first and second p-type semiconductor layer as thus described, the fill factor is greatly improved, and the open-circuit voltage and the short-circuit current density increase, thereby further improving photoelectric conversion efficiency. The reason such an effect can be achieved is specifically described below.

Since a band gap of the first p-type semiconductor layer has widened as compared to the case where the nitrogen atom concentration in the layer is smaller than 0.5 atomic %, a large discontinuity has occurred on a conduction band, resulting from a difference between the wide band gap of the first p-type semiconductor layer and a band gap of an i-type semiconductor layer. It is desirable here that a conductivity determination element have been doped into the second p-type semiconductor layer such that the Fermi-level of the second p-type semiconductor layer is more sufficiently shifted to the valence band side than the Fermi-level of the i-type semiconductor layer. By provision of the second p-type semiconductor layer between the first p-type semiconductor layer and the i-type semiconductor layer in the above-mentioned manner, the conduction band of the second p-type semiconductor layer is positioned on the Fermi level between the conduction bands of the p-type semiconductor layer and the i-type semiconductor layer, which can alleviate the discontinuity of the conduction band from the first p-type semiconductor layer to the i-type semiconductor layer. This is considered to result in reduction in recombination at the p/i layer interface, caused by the discontinuity of the conduction band described above. This effect produces large improvement in fill factor, and improvement in open-circuit voltage and short-circuit current density. The thickness of the second p-type semiconductor layer may be about 5 to 40 nm, and is more preferably from 5 to 20 nm. The thickness of the first p-type semiconductor layer may be about 5 to 40 nm, and is more preferably from 5 to 20 nm.

It is further preferable that the first p-type semiconductor layer be a microcrystalline silicon layer with nitrogen atoms added, so as to increase the conductivity of the p-type semiconductor layer and thus to reduce series resistance, resulting in an increase in fill factor of the photoelectric conversion device, and thereby high photoelectric conversion efficiency can be obtained.

It is to be noted that the p-type semiconductor layer 12 may contain carbon atoms as an impurity. In such a case, however, the p-type semiconductor layer 12 does not practically contain a crystalline phase of silicon carbide.

(i-Type Semiconductor Layer)

The i-type semiconductor layer 13 is a microcrystalline silicon layer added with no particular impurity. However, the i-type semiconductor layer 13 may contain a small amount of impurity element as long as being made of substantially intrinsic semiconductor. In this case, although amorphous silicon may be used for the i-type semiconductor layer 13 in place of microcrystalline silicon, microcrystalline silicon is more preferably used in light of obtaining high photoelectric conversion efficiency since it is free from photodegradation. Further, especially in the photoelectric conversion device having a second p-type semiconductor layer made of microcrystalline silicon as above described, the i-type semiconductor layer 13 is preferably made of microcrystalline silicon, from the viewpoint of alleviating the discontinuity of the band gap of the interface between the second p-type semiconductor layer and the i-type semiconductor layer 13. More specifically, the second p-type semiconductor layer made of microcrystalline silicon and the i-type semiconductor layer 13 made of amorphous silicon form a hetero-junction, whereas the second p-type semiconductor layer made of microcrystalline silicon and the i-type semiconductor layer 13 made of microcrystalline silicon form a homo-junction. In the latter case, the second p-type semiconductor layer can enhance the effect of suppressing the p/i layer interface recombination more than the former case. It is therefore preferable that the i-type semiconductor layer 13 be made of microcrystalline silicon, so as to reduce particularly the interface recombination and thus to increase the fill factor, and thereby high photoelectric conversion efficiency can be obtained.

(n-Type Semiconductor Layer)

The n-type semiconductor layer 14 can be an amorphous silicon layer or a microcrystalline silicon layer, with an n-type doping element doped therein. As the n-type doping element, impurity atoms, such as phosphorous, nitrogen or oxygen, can be used.

Further, it is preferable that the n-type semiconductor layer 14 contain nitrogen atoms at a concentration of 0.001 to 10 atomic %, so as to increase the open-circuit voltage and thereby high photoelectric conversion efficiency can be obtained, as compared to an n-type semiconductor layer containing no nitrogen atom. The following are among those considered as the reasons for the increase in open-circuit voltage by containing nitrogen atoms: (I) a band gap of the n-type semiconductor layer widens and a diffusion potential thus increases; and (II) the effect of passivation of the crystal grain boundary interface as well as passivation of the i/n layer interface is produced by containing nitrogen atoms, to reduce the interface recombination.

It is further preferable that the n-type semiconductor layer 14 contain nitrogen atoms at a concentration of 0.01 to 10 atomic %. In this arrangement, in addition to improvement of the open-circuit voltage, a light transmittance is improved to increase a short-circuit current density, thereby further improving photoelectric conversion efficiency. Moreover, when nitrogen atoms as the impurity element are added to the n-type semiconductor layer 14 as described above, it is possible to obtain the effect of improving the open-circuit voltage, with the impurity contained at a low concentration of not higher than 10 atomic %, as compared to the case of adding carbon atoms as in the conventional technique. Therefore, on the top of the effects of (I) and (II) above, the following effects can also be expected, taking advantage of the low-concentration impurity: (III) an increase in defect density and an increase in ratio of the amorphous phase in the n-type semiconductor layer 14, caused by the addition of the impurity, can be suppressed, (IV) a decrease in activation efficiency of the n-type doping element, caused by the addition of the impurity, can be suppressed; and (V) with no carbon atom in use, carbon dioxide emission does not increase during the production.

The n-type semiconductor layer 14 may be a layer formed by adding nitrogen atoms to amorphous silicon, but it preferably contains crystalline silicon, so as to obtain high conductivity and thus to reduce series resistance of a photoelectric conversion layer. Namely, it is preferable to use a layer formed by adding nitrogen atoms to microcrystalline silicon, so as to increase the fill factor, and thereby high photoelectric conversion efficiency can be obtained. It is further preferable that a intensity ratio of crystalline volume fraction in a measured spectrum of Raman scattering spectroscopy of the n-type semiconductor layer 14 be not less than 3, so as to form a favorable junction with the i-type semiconductor layer 13. In such a favorable junction state, the foregoing effect of suppressing the i/n layer interface recombination can be easily obtained between the i-type semiconductor layer 13 and the n-type semiconductor layer 14, and thereby high photoelectric conversion efficiency can be obtained.

It is further preferable that the n-type semiconductor layer 14 have a first n-type semiconductor layer which is made of microcrystalline silicon and not actively with nitrogen atoms added, and a second n-type semiconductor layer which is made of amorphous silicon or microcrystalline silicon and with nitrogen atoms added. In this case, the first n-type semiconductor layer is formed between the second n-type semiconductor layer and the i-type semiconductor layer 13, and the nitrogen atom concentration in the second n-type semiconductor layer is preferably from 4 to 10 atomic %. On the other hand, the first n-type semiconductor layer contains almost no nitrogen atom since a raw material gas containing nitrogen atoms is not used during formation of the first n-type semiconductor layer. However, during the formation, nitrogen atoms may be contained in such a trace amount as to be naturally taken into the layer due to degassing or the presence of a remaining gas in a vacuum chamber. By constituting the n-type semiconductor layer 14 of the first and second n-type semiconductor layer as thus described, the fill factor is greatly improved, and the open-circuit voltage and the short-circuit current density increase, thereby further improving photoelectric conversion efficiency. The reason such an effect can be achieved is specifically described below.

Since a band gap of the second n-type semiconductor layer has widened as compared to the case where the nitrogen atom concentration in the layer is smaller than 4 atomic %, a large discontinuity has occurred on a valence band, resulting from a difference between the wide band gap of the second n-type semiconductor layer and a band gap of an i-type semiconductor layer. It is preferable here that the n-type doping element have been doped into the first n-type semiconductor layer such that the Fermi-level of the first n-type semiconductor layer is more sufficiently shifted to the conduction band side than the Fermi-level of the i-type semiconductor layer. By provision of the first n-type semiconductor layer between the second n-type semiconductor layer and the i-type semiconductor layer in the above-mentioned manner, the valence band of the first n-type semiconductor layer is positioned on the Fermi level between the valence bands of the n-type semiconductor layer and the i-type semiconductor layer, which can alleviate the discontinuity of the valence band from the second n-type semiconductor layer to the i-type semiconductor. This is considered to result in reduction in recombination at the i/n layer interface, caused by the discontinuity of the valence band described above. This effect produces large improvement in fill factor, and improvement in open-circuit voltage and short-circuit current density. The thickness of the first n-type semiconductor layer may be about 5 to 40 nm, and is more preferably from 5 to 20 nm. The thickness of the second n-type semiconductor layer may be about 5 to 40 nm, and is more preferably from 5 to 20 nm.

It is further preferable that the second n-type semiconductor layer be a microcrystalline silicon layer containing nitrogen atoms, so as to increase the conductivity of the n-type semiconductor layer and thus to reduce series resistance, resulting in an increase in fill factor of the photoelectric conversion device, and thereby high photoelectric conversion efficiency can be obtained, as described above. When the second n-type semiconductor layer is a microcrystalline silicon layer containing nitrogen atoms, its intensity ratio is preferably not less than 3, so as to form a favorable junction with the first n-type semiconductor layer made of microcrystalline silicon, and thereby high photoelectric conversion efficiency can be obtained.

Further, when the n-type semiconductor layer 14 contains nitrogen atoms, the p-type semiconductor layer 12 may contain carbon atoms. Such a state can be confirmed, for example, in observing a Raman scattering spectrum of the microcrystalline silicon containing carbon atoms, by not substantially detecting a peak attributed to a silicon-carbon bonding constituting a silicon carbide crystal. The above-mentioned state may also be confined, in performing X-ray diffraction, by not substantially detecting a peak attributed to the silicon carbide crystal structure.

Moreover, the p-type semiconductor layer 12 may contain both the impurities of carbon atoms and nitrogen atoms.

<Description of Method for Producing Photoelectric Conversion Layer>

As a method for forming the photoelectric conversion layer 10, a typical method, CVD, may be cited. Examples of CVD may include normal-pressure CVD, low-pressure CVD, plasma CVD, thermal CVD, hot-wire CVD, and MOCVD, but in the present embodiment, plasma CVD was used. A silicon-containing gas for use in formation of the photoelectric conversion layer 10 by plasma CVD is not particularly restricted as long as containing silicon atoms such as $SiH_4$ or $Si_2H_6$, but typically, a gas containing $SiH_4$ may be used. Examples of a dilution gas in simultaneous use with the silicon-containing gas may include $H_2$, Ar and He, but $H_2$ is particularly preferably used in formation of amorphous silicon and microcrystalline silicon. Further, in formation of the p-type semiconductor layer and the n-type semiconductor layer, doping gases for the respective layers are used simultaneously with the silicon-containing gas and the dilution gas. The respective doping gases are not particularly restricted as long as containing a conductivity determination element of the type targeted. Typically, however, $B_2H_6$ may be used when the p-type doping element is boron, and $PH_3$ may be used when the n-type doping element is phosphorous. By appropriately controlling film formation parameters, such as a substrate temperature, pressure, gas flow rate, and input power to plasma, in formation of the photoelectric conversion layer 10 by plasma CVD, it is possible to control abundance ratios of the amorphous phase and the crystalline phase.

In the example embodiment presented herein, the nitrogen-atom-containing gas for use in formation of the p-type semiconductor layer 12 or the n-type semiconductor layer 14 is not particularly restricted as long as containing nitrogen atoms such as $N_2$ or $NH_3$, but in the present embodiment, a gas containing $N_2$ was used. $N_2$ is particularly preferred since it has advantages of being produced at low cost by separation from the air using a method such as a low-temperature processing type gas separating method, and being a stable substance having no need for harm-excluding treatment.

(Formation of p-Type Semiconductor Layer)

In a step of forming at least one photoelectric conversion layer that comprises one or more of the p-type semiconductor layers, i-type semiconductor layers and n-type semiconductor layers on the substrate through the conductive film, wherein the p-type semiconductor layer is formed using a raw material gas containing the silicon atoms, the p-type conductive element and nitrogen atoms, so as to contain nitrogen atoms at a concentration of 0.0005 to 13 atomic %, more preferably from 0.001 to 10 atomic %, and further preferably from 0.5 to 8 atomic %. In this case, the process for forming the p-type semiconductor layer may comprise: a process for forming the first p-type semiconductor layer containing nitrogen atoms at a concentration of 0.5 to 10 atom %, using a raw material gas containing the silicon atoms, the p-type conductive element and nitrogen atoms; and a process for forming the second p-type semiconductor layer using a raw material gas containing the silicon atoms and the p-type conductive element. Further, the p-type semiconductor layer may be formed so as to become a microcrystalline silicon layer.

In formation of the p-type semiconductor layer 12 containing nitrogen atoms, when the above-mentioned gas containing $N_2$ and $SiH_4$ is used, a gas flow rate ratio ($[N_2]/[SiH_4]$) may be controlled to the range which is preferably from 0.0001 to 2.6, more preferably from 0.0002 to 2, and particularly preferably from 0.1 to 1.6.

Further, when the raw material gas for forming the p-type semiconductor layer 12 containing nitrogen atoms further contains $B_2H_6$, a gas flow rate ratio ($[B_2H_6]/[SiH_4]$) may be controlled to the range preferably from 0.003 to 0.01.

Moreover, when the raw material gas for forming the p-type semiconductor layer 12 containing nitrogen atoms contains $B_2H_6$, and the p-type semiconductor layer 12 is formed such that the nitrogen atom concentration A (atomic %) and the boron atom concentration B (atomic %) in the layer satisfy above Relational formula 1: $0.11-0.009A+0.042A^2 \leq B \leq 0.2+0.2A+0.05A^2$, it is preferable to set the gas flow rate ratio ($[N_2]/[SiH_4]$) to the range from 0.002 to 3.0, and the gas flow rate ratio ($[B_2H_6]/[SiH_4]$) to the range preferably from 0.033 to 4.2, from the viewpoint that above Relational formula 1 can be controlled with ease.

In formation of the p-type semiconductor layer containing nitrogen atoms and the boron atoms, the silicon atoms may be contained as the above-mentioned crystalline silicon-phase. In this case, it is preferable that the raw material gas further contain $H_2$ and the gas flow rate ratio ($[H_2]/[SiH_4]$) be controlled to the range of 120 to 900, in terms of allowing achievement of an appropriate crystallization fraction (or crystalline volume fraction) so as to improve characteristics of the photoelectric conversion device.

Further, both or either of the following processes may be performed: heating the p-type semiconductor layer containing nitrogen atoms and the boron atoms at 180 to 350° C. before formation of the i-type semiconductor layer; and/or heating the p-type semiconductor layer containing nitrogen atoms and the boron atoms at 180 to 350° C. after formation of the photoelectric conversion layer. By this heating process, the p-type doping element having been inactivated by hydrogen can be reactivated, raising the carrier concentration in the p-type semiconductor layer 12, and thereby photoelectric conversion efficiency can be improved.

Moreover, it is desirable to perform the above-mentioned heating process because, by heating at 180 to 350° C. after formation of the p-type semiconductor layer 12, the p-type doping element having been inactivated by hydrogen can be reactivated, raising the carrier concentration in the p-type semiconductor layer 12, and thereby photoelectric conversion efficiency can be improved. In this heating process, its effect can be obtained by heating the p-type semiconductor layer 12 after formation. However, when the p-type semiconductor layer 12 might be exposed to hydrogen radicals again in subsequent processes for forming the i-type semiconductor layer and forming the n-type semiconductor layer, the above-mentioned heating process may be performed after the process for forming the photoelectric conversion layer, or may be performed twice, i.e. after formation of the p-type semiconductor layer and after formation of the n-type semiconductor layer.

(Formation of n-Type Semiconductor Layer)

In a step of forming one or more photoelectric conversion layers that comprise the p-type semiconductor layer, the i-type semiconductor layer, and the n-type semiconductor layer on the substrate through the conductive film, wherein the n-type semiconductor layer is formed using a raw material gas containing the silicon atoms, the n-type conductive element and nitrogen atoms, so as to contain nitrogen atoms at a concentration of 0.0005 to 10 atomic %, and more preferably from 0.001 to 10 atomic %. In this case, the process for forming the n-type semiconductor layer may comprise: a process for forming the first n-type semiconductor layer using a raw material gas containing silicon atoms and the n-type conductive element; and a process for forming the second n-type semiconductor layer containing nitrogen atoms at a concentration of 4 to 10 atom %, using a raw material gas containing silicon atoms, the n-type conductive element and nitrogen atoms. Further, the n-type semiconductor layer may be formed so as to become a microcrystalline silicon layer.

When the raw material gas for forming the n-type semiconductor layer containing nitrogen atoms contains $N_2$ and $SiH_4$, a gas flow rate ratio ($[N_2]/[SiH_4]$) may be controlled to the range from 0.0001 to 2, and preferably from 0.0002 to 2.

When the raw material gas for forming the n-type semiconductor layer containing nitrogen atoms further contains $PH_3$, a gas flow rate ratio ($[PH_3]/[SiH_4]$) is preferably controlled to the range from 0.0125 to 0.025.

<Description of Electrode and Transparent Conductive Layer>

The electrode 16 may have at least one conductive layer, and the higher its light reflectivity and conductivity are, the more preferable it is. Examples of a material satisfying such conditions may include metal materials having high visible light reflectivity, such as silver, aluminum, titanium and palladium, and alloys thereof. The electrode 16 is formed on the photoelectric conversion layer 10 by CVD, sputtering, vacuum evaporation, electron beam evaporation, spraying, screen printing, or the like. The electrode 16 contributes to improvement of photoelectric conversion efficiency since it reflects light having not been absorbed in the photoelectric conversion layer 10, to be transmitted back to the photoelectric conversion layer 10. Further, when the transparent conductive layer 15 is formed between the photoelectric conversion layer 10 and the electrode 16, the effect of suppressing diffusion of an element contained in the electrode 16 toward the photoelectric conversion layer 10 can be obtained, in addition to the effect of enhancing trapping of incident light and the effect of suppressing the light reflectivity. The transparent conductive layer 15 can be formed in the same manner using the same material as in the formation of the transparent conductive layer 11b. However, when the present invention is applied to the substrate type structure, the electrode 16 is desirably formed in a grid shape not uniformly covering the surface, such as a comb shape.

By the above-mentioned constitution, it is possible to obtain a superstrate type (or substrate type) photoelectric conversion device 100 with large open-circuit voltage, short-circuit current density and fill factor, and high photoelectric conversion efficiency.

Embodiment 2

Figure 2:
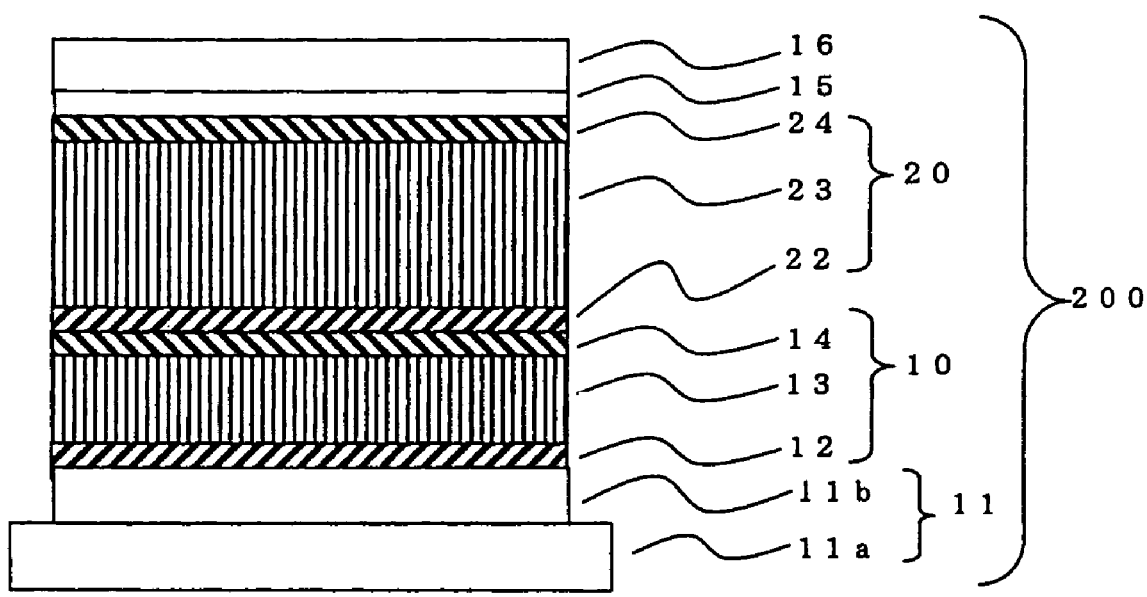
FIG. 2 is a cross-sectional view schematically showing a superstrate laminated type photoelectric conversion device of Embodiment 2.

Next, a superstrate laminated type photoelectric conversion device 200 having two photoelectric conversion layers is described as Embodiment 2, a different embodiment from the above, using FIG. 2. It is to be noted that in FIG. 2, the same constituents as those of Embodiment 1 shown in FIG. 1 are provided with the same reference numerals as in FIG. 1.

This superstrate laminated type photoelectric conversion device 200 is constituted by laminating, on a substrate 11, a first photoelectric conversion layer 10, a second photoelectric conversion layer 20, a transparent conductive layer 15, and an electrode 16, in this order. Among these constituents, the substrate 11, the transparent conductive layer 15 and the electrode 16 can be the same ones as those used for the foregoing superstrate type photoelectric conversion device 100 can be used, and the functions of the respective layers are also the same as those of the superstrate type photoelectric conversion device 100. Hence descriptions of those constituents are omitted.

Since the first photoelectric conversion layer 10 is positioned on the light incident side, only lights transmitted through the first photoelectric conversion layer 10 are incident on the second photoelectric conversion layer 20. Therefore, application of the laminated structure to a photoelectric conversion device provides advantages of being able to effectively use lights by reception thereof in divided incident light spectrum regions, and obtaining a high open-circuit voltage. In order to enhance those effects, the band gap of the first photoelectric conversion layer 10 on the light incident side is made larger than the band gap of the second photoelectric conversion layer 20 when the two layers are laminated, so that short wavelength lights among incident lights are absorbed in the first photoelectric conversion layer 10 whereas long wavelength lights among the incident lights are absorbed in the second photoelectric conversion layer 20, and thereby each of the wavelength bands can be effectively used.

The first and second photoelectric conversion layers 10 and 20 may be laminated such that the respective pin junctions are formed in the equivalent direction and the p-type semiconductor layer is positioned on the light incident side. The same can be said in the case of laminating three or more photoelectric conversion layers. It is to be noted that in FIG. 2, reference numeral 22 denotes a p-type semiconductor layer, reference numeral 23 denotes an i-type semiconductor layer and reference numeral 24 denotes an n-type semiconductor layer. The respective thicknesses of the first and second photoelectric conversion layers 10 and 20 are not particularly restricted. However, in the first photoelectric conversion layer 10, the thickness of the p-type semiconductor layer 12 may be from 5 to 50 nm and is preferably from 10 to 30 nm, the thickness of the i-type semiconductor layer 13 may be from 100 to 500 nm and is preferably from 200 to 400 nm, and the thickness of the n-type semiconductor layer 14 may be from 5 to 50 nm and is preferably from 10 to 30 nm. In the second photoelectric conversion layer 20, the thickness of the p-type semiconductor layer 22 may be from 5 to 50 nm and is preferably from 10 to 30 nm, the thickness of the i-type semiconductor layer 23 may be from 1,000 to 5,000 nm and is preferably from 2,000 to 4,000 nm, and the thickness of the n-type semiconductor layer 24 may be from 5 to 100 nm and is preferably from 10 to 30 nm.

An intermediate layer may be formed between the first and second photoelectric conversion layers 10 and 20 (or between each photoelectric conversion layer in the case of laminating three or more layers). In this case, the intermediate layer is desirably a transparent conductive film. With this intermediate layer provided, lights having been incident on the intermediate layer from the first photoelectric conversion layer 10 are partly reflected by the intermediate layer, and the rest of the lights are transmitted through the intermediate layer to be incident on the second photoelectric conversion layer 20, thereby enabling control of an amount of light incident on each of the photoelectric conversion layers. By such a control, the respective light current values of the photoelectric conversion layers 10 and 20 are made equivalent, which allows photoproduction carriers generated in each of the photoelectric conversion layers 10 and 20 to contribute to a short-circuit current of the laminated type photoelectric conversion device, with almost no waste. This thus results in an increase in short-circuit current of the laminated photoelectric conversion device, and thereby photoelectric conversion efficiency can be improved.

In this photoelectric conversion device 200, the same p-type semiconductor layer containing nitrogen atoms as that of Embodiment 1 is used for the p-type semiconductor layer in at least one of the first and second photoelectric conversion layers 10 and 20 (or one of all the photoelectric conversion layers in the case of laminating three or more layers). In such an arrangement, the same effect as that obtained in the foregoing superstrate type photoelectric conversion device 100 can be obtained, and therefore, photoelectric conversion efficiency of the laminated type photoelectric conversion device 200 improves as compared to a laminated type photoelectric conversion device having a p-type semiconductor layer containing no nitrogen atom.

It is more preferable that the i-type semiconductor layer adjacent to the second p-type semiconductor layer be a microcrystalline silicon layer, so as to not only prevent photodegradation of the i-type semiconductor layer but to further enhance the effect of the second p-type semiconductor layer of suppressing the p/i layer interface recombination, resulting in an increase in fill factor, and thereby high photoelectric conversion efficiency can be obtained.

It should be noted that in the case of applying above-mentioned Embodiment 2 to the substrate type structure, the electrode 16 is positioned on the light incident side, unlike the case of the above-mentioned superstrate laminated type photoelectric conversion device 200. Hence in this application, attention needs to be paid to the following: the first photoelectric conversion layer 10 and the second photoelectric conversion layer 20 of the foregoing description change positions; each of the photoelectric conversion layers 10 and 20 is formed in the order of the pin junction from the electrode 16 side (light incident side); and the electrode 16 is in a grid shape not uniformly covering the surface. Although such attention is needed, all effects to be obtained in this application are the same as those obtained in the superstrate type structure As thus described, in a photoelectric conversion device and a laminated type photoelectric conversion device according to the present invention, it is possible to increase an open-circuit voltage, a short-circuit current density and a fill factor so that photoelectric conversion efficiency can be improved, without using a material causing an increase in carbon dioxide emission during production of the device.

In the following, Examples and Comparative Examples of the present invention are described.

EXAMPLES

Examples 1 to 17 and Comparative Examples 1 and 2

Examples 1 to 9

In Examples 1 to 9, the superstrate type photoelectric conversion device 100 shown in FIG. 1 was manufactured as follows.

As the substrate 11, a white glass board (product name "Asahi-U", manufactured by ASAHI GLASS CO., LTD.) was used which had dimensions of 127 mm (length)×127 mm (width)×1.8 mm (thickness) and was constituted by forming the transparent conductive film 11b on the surface of the light permeable substrate 11a. On this substrate 11, a zinc oxide layer having a thickness of 50 nm was formed by magnetron sputtering. Thereafter, under below-mentioned conditions, the photoelectric conversion layer 10 was deposited by plasma CVD in the order of the p-type semiconductor layer 12, the i-type semiconductor layer 13 and the n-type semiconductor layer 14. A plasma CVD system used for formation of the photoelectric conversion layer 10 was an ultra-high vacuum system capable of forming a high-quality photoelectric conversion layer where a very few amount of impurity elements was mixed. Subsequently, on the photoelectric conversion layer 10, a zinc oxide layer having a thickness of 50 nm as the transparent conductive layer 15, and a silver layer having a thickness of 500 nm as the electrode 16 were sequentially deposited by magnetron sputtering, to obtain a superstrate type photoelectric conversion device 100.

Each of the layers constituting the photoelectric conversion layer 10 was formed under the following conditions.

In formation of the p-type semiconductor layer 12, $SiH_4$, $H_2$, $B_2H_6$ and $N_2$ were used as raw material gases. A gas flow rate ratio ($[H_2]/[SiH_4]$) was 150, a gas flow rate ratio ($[B_2H_6]/[SiH_4]$) was changed as shown in Table 1, and a gas flow rate ratio ($[N_2]/[SiH_4]$) was also changed as shown in Table 1. The nitrogen atom concentrations in the layer at those changed gas flow rate ratios were put down in Table 1 along with the ratios. It is to be noted that the nitrogen atom concentration in the layer is a value (atomic %) obtained as a result of performing sensitive secondary ion mass spectrometry on the p-type semiconductor layer 12. In order to increase an amount of light incident on the i-type semiconductor layer as a photoactive layer, the p-type semiconductor layer 12 desirably has as small a thickness as possible within the bounds of not impairing its function as a p-type layer, and in the present examples, the thickness of the p-type semiconductor layer 12 was 20 nm.

In formation of the i-type semiconductor layer 13, $SiH_4$ and $H_2$ were used as raw material gases. A gas flow rate ratio ($[H_2]/[SiH_4]$) was 80, and the layer was formed so as to have a thickness of 2,500 nm.

In formation of the n-type semiconductor layer 14, $SiH_4$, $H_2$ and $PH_3$ were used as raw material gases. A gas flow rate ratio ($[H_2]/[SiH_4]$) was 20, a gas flow rate ratio ($[PH_3]/[SiH_4]$) was adjusted such that the phosphorous atom concentration in the layer was 0.01 atomic %, and the n-type semiconductor layer 14 was formed so as to have a thickness of 20 nm.

It should be noted that the substrate temperatures in formation of the p-type semiconductor layer 12, the i-type semiconductor layer 13 and the n-type semiconductor layer 14 by plasma CVD, were 170° C., 180° C. and 160° C., respectively.

Current-voltage characteristics per 1 $cm^2$ cell area of each of the photoelectric conversion devices of Examples 1 to 9 as thus obtained were measured under an irradiation condition of AM 1.5 (100 mW/$cm^2$), and the measurement results were summarized in Table 1. In particular, dependency of the open-circuit voltage on the nitrogen atom concentration was shown in FIG. 3, and dependency of the short-circuit current density on the nitrogen atom concentration was shown in FIG. 4. However, no characteristic value of Example 9 was shown in FIGS. 3 and 4, because in Example 9 where the nitrogen atom concentration was 13 atomic %, both the open-circuit voltage and the short-circuit current were extremely low.

Examples 10 to 14

In Examples 10 to 14, the superstrate type photoelectric conversion device 100 was manufactured in the following manner under the same conditions as in Examples 1 to 9 except for conditions for forming the p-type semiconductor layer 12.

The p-type semiconductor layer 12 was formed by forming a first p-type semiconductor layer, containing nitrogen atoms in the same concentration range as that in each of Examples 5 to 8, on the substrate 11 and then depositing a second p-type semiconductor layer, containing no nitrogen, on the first p-type semiconductor layer. In formation of the first p-type semiconductor layer, a gas flow rate ratio ($[H_2]/[SiH_4]$) was 150, and other layer formation conditions were shown in Table 1. In formation of the second p-type semiconductor layer, $SiH_4$, $H_2$ and $B_2H_6$ were used as raw material gases. A gas flow rate ratio ($[H_2]/[SiH_4]$) was 150, and a gas flow rate ratio ($[B_2H_6]/[SiH_4]$) was shown in Table 1. The thicknesses of the first and second p-type semiconductor layers were 15 nm and 10 nm, respectively.

Figure 3:
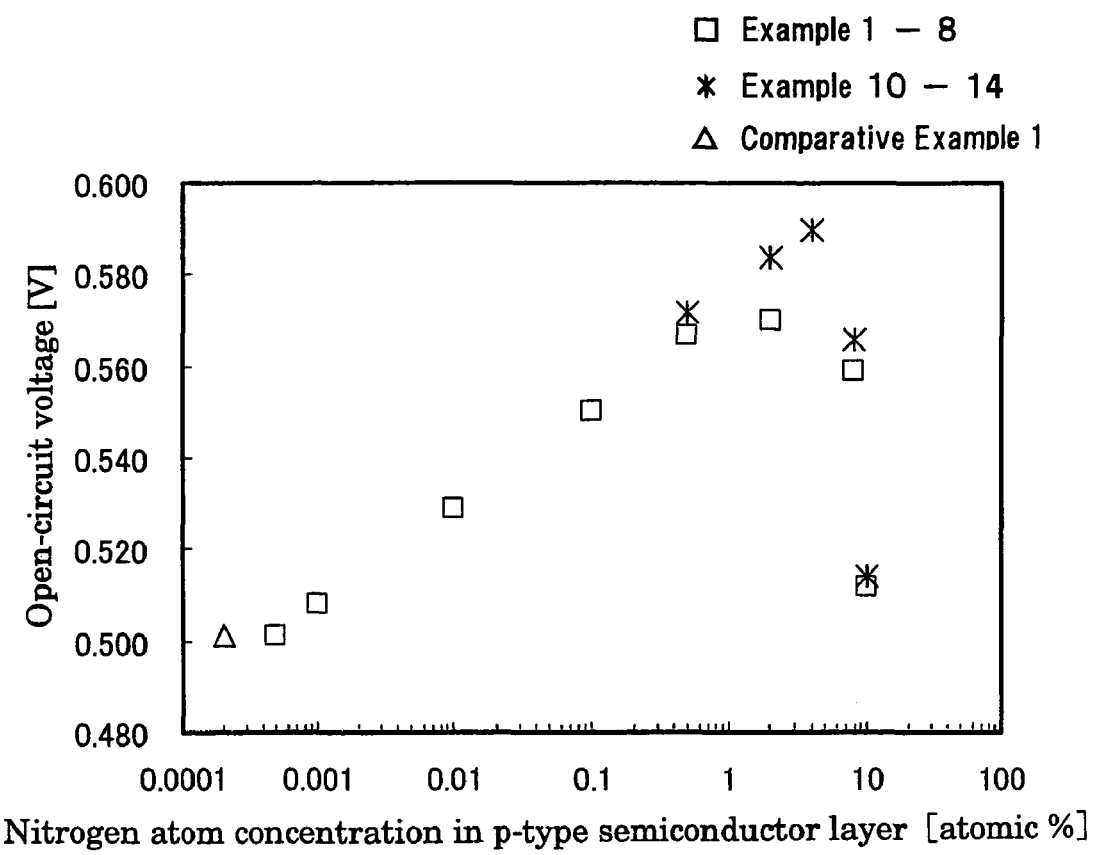
FIG. 3 is a graph showing dependency of an open-circuit voltage on a nitrogen atom concentration in a p-type semiconductor layer in Examples 1 to 14 and Comparative Example 1.
Figure 4:
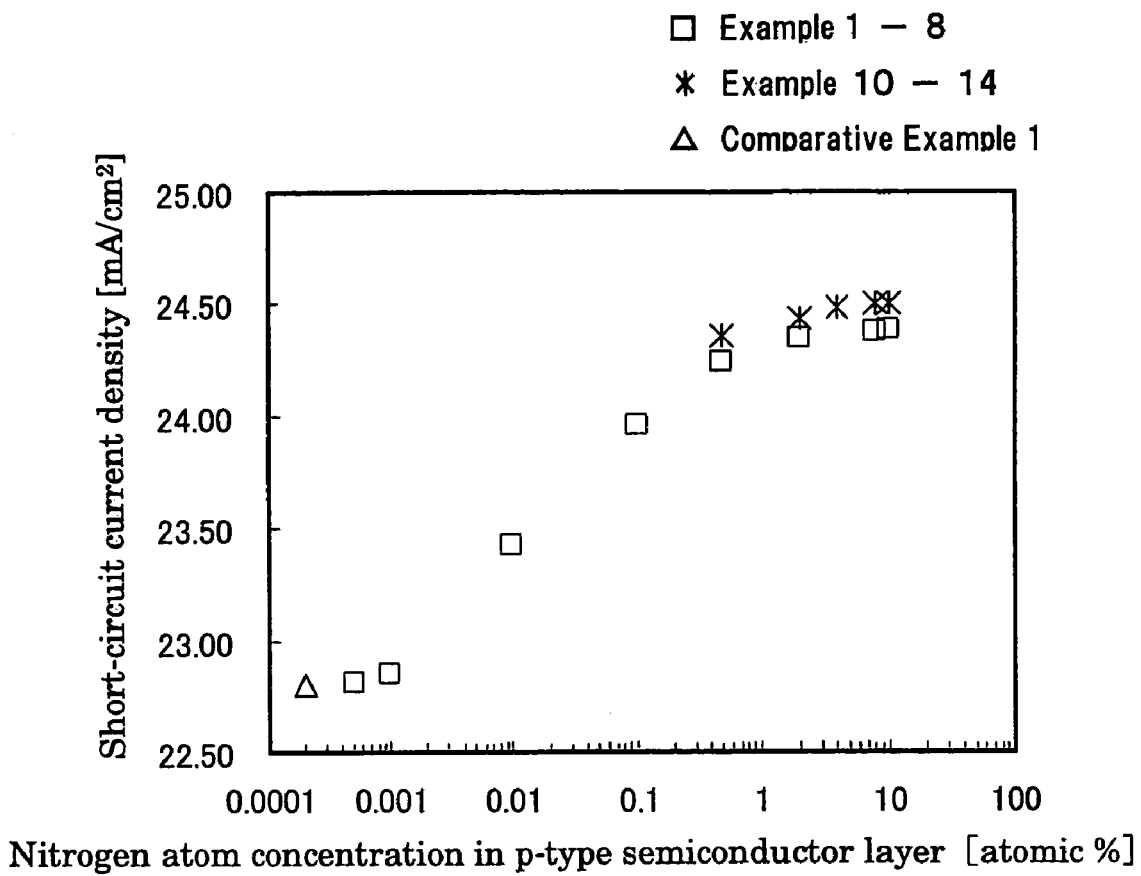
FIG. 4 is a graph showing dependency of a short-circuit current density on the nitrogen atom concentration in the p-type semiconductor layer in Examples 1 to 14 and Comparative Example 1.

Current-voltage characteristics per 1 $cm^2$ cell area of the photoelectric conversion device of Examples 10 to 14 as thus obtained were measured under an irradiation condition of AM 1.5 (100 mW/$cm^2$), and the measurement results were shown in Table 1, FIGS. 3 and 4, as in Examples 1 to 8.

Example 15

In Example 15, the superstrate type photoelectric conversion device 100 was manufactured in the following manner under the same conditions as in Example 6 except for conditions for forming the p-type semiconductor layer 12.

In formation of the p-type semiconductor layer 12, a a gas flow rate ratio ($[H_2]/[SiH_4]$) was 5, a gas flow rate ratio ($[B_2H_6]/[SiH_4]$) was adjusted such that the boron concentration in the layer was 0.1 atomic %, and a gas flow rate ratio ($[N_2]/[SiH_4]$) was adjusted such that the nitrogen atom concentration in the layer was 2 atomic %.

Current-voltage characteristics per 1 $cm^2$ cell area of the photoelectric conversion device as thus obtained were measured under an irradiation condition of AM 1.5 (100 $mW/cm^2$), and the measurement results were the open-circuit voltage of 0.567 V, the short-current density of 24.2 $mA/cm^2$, the fill factor of 0.705, and the photoelectric conversion efficiency of 9.67%. It is to be noted that the results of Example 15 are omitted from the table and drawings.

Comparative Example 1

The superstrate type photoelectric conversion device 100 was manufactured under the same conditions as in Examples 1 to 9 except for conditions for forming the p-type semiconductor layer 12. The p-type semiconductor layer 12 was formed under the same conditions as in Example 1 except that the $N_2$ gas is not allowed to flow during formation of the layer. The p-type semiconductor layer 12 was subjected to the same secondary ion mass spectrometry as in the above examples, with a result that the nitrogen atom concentration was 0.0002 atomic %. As in the above examples, current-voltage characteristics per 1 $cm^2$ cell area of the photoelectric conversion device as thus obtained were measured under an irradiation condition of AM 1.5 (100 $mW/cm^2$), and the measurement results were shown in Table 1, FIGS. 3 and 4.

TABLE 1

|  | 1-1 | 1-2 | 1-3 | 1-4 | 1-5 | 1-6 | 1-7 |
| --- | --- | --- | --- | --- | --- | --- | --- |
| C. Example 1 | 0 | 0.0030 | 0.0002 | 0.501 | 22.80 | 0.711 | 8.12 |
| Example 1 | 0.0001 | 0.0030 | 0.0005 | 0.501 | 22.81 | 0.710 | 8.11 |
| Example 2 | 0.0002 | 0.0030 | 0.001 | 0.508 | 22.85 | 0.713 | 8.28 |
| Example 3 | 0.002 | 0.0030 | 0.01 | 0.529 | 23.42 | 0.720 | 8.92 |
| Example 4 | 0.02 | 0.0035 | 0.1 | 0.550 | 23.96 | 0.720 | 9.49 |
| Example 5 | 0.1 | 0.0040 | 0.5 | 0.567 | 24.24 | 0.723 | 9.94 |
| Example 6 | 0.4 | 0.0050 | 2 | 0.570 | 24.35 | 0.723 | 10.03 |
| Example 7 | 1.6 | 0.0070 | 8 | 0.559 | 24.38 | 0.718 | 9.79 |
| Example 8 | 2.0 | 0.0100 | 10 | 0.512 | 24.39 | 0.690 | 8.62 |
| Example 9 | 2.6 | 0.0200 | 13 | 0.330 | 10.30 | 0.211 | 0.72 |
| Example 10 | 0.1 | 0.0040 | 0.5 | 0.572 | 24.36 | 0.731 | 10.19 |
| Example 11 | 0.4 | 0.0040 | 2 | 0.584 | 24.44 | 0.734 | 10.48 |
| Example 12 | 0.8 | 0.0050 | 4 | 0.590 | 24.48 | 0.735 | 10.62 |
| Example 13 | 1.6 | 0.0070 | 8 | 0.566 | 24.50 | 0.720 | 9.98 |
| Example 14 | 2.0 | 0.0100 | 10 | 0.514 | 24.50 | 0.700 | 8.82 |

1-1: Gas flow rate ratio ($[H_2]/[SiH_4]$)
1-2: Gas flow rate ratio ($[B_2H_6]/[SiH_4]$)
1-3: Nitrogen atom concentration in the p-type semiconductor layer [atomic %]
1-4: Open-circuit voltage [V]
1-5: Short-circuit current density [$mA/cm^2$]
1-6: Fill factor
1-7: Photoelectric conversion efficiency [%]

Consideration of Examples 1 to 15 and Comparative Example 1

In the following, consideration was made of the comparative results of Examples 1 to 15 and Comparative Example 1, based upon Table 1 and FIG. 3.

The p-type semiconductor layer of Comparative Example 1, having been formed without using the $N_2$ gas, contained nitrogen at a concentration of 0.0002 atomic %. This indicates that a nitrogen impurity, present due to degassing or in a remaining gas in the vacuum chamber of the plasma CVD system used in Examples 1 to 15, is mixed in a trace amount into the p-type semiconductor layer during formation of the layer. However, since the plasma CVD system is an ultra-high vacuum system, above Comparative Example 1 is regarded as having the smallest amount of impurity nitrogen in the p-type semiconductor layer, and compared to other Examples and Comparative Examples based upon such a regard.

In Example 1 where the nitrogen atom concentration was lower than 0.001 atomic %, the open-circuit voltage was no different from that in Comparative Example 1. This is presumably because the nitrogen atom concentration, which is less than 0.001 atomic %, in Example 1 was a value with which neither effects produced by addition of nitrogen, the effect of increasing the band gap nor the passivation effect of the crystal grain boundary and the p/i layer interface, could be obtained. In Examples 2 to 8 where the p-type semiconductor layer was formed such that nitrogen atom concentration was not lower than 0.001 atomic %, any of the respective open-circuit voltages obtained exceeded the open-circuit voltage of 0.501 V in Comparative Example 1. Especially in Example 6, the largest effect of improving the open-circuit voltage was exerted to obtain an open-circuit voltage of 0.57 V. Namely, it is found that the nitrogen atom concentration in the p-type semiconductor layer is preferably not lower than 0.001 atomic % for improving the open-circuit voltage.

In Example 9 where the nitrogen atom concentration was 13 atomic %, the open-circuit voltage was 0.33 V, which was a large decrease from the open-circuit voltage of Comparative Example 1. In addition to this, the short-circuit current density and the fill factor also largely decreased, and the photoelectric conversion efficiency decreased to close to zero. It is thereby considered that excessive addition of nitrogen to the p-type semiconductor layer caused an increase in ratio of a silicon nitride phase as an insulator, to decrease electric conduction, and thereby the photoproduction carrier collecting efficiency extremely decreased.

Further, in each of Examples 1 to 9 and Comparative Example 1, the gas flow rate ratio ($[B_2H_6]/[SiH_4]$) was controlled such that the p-type semiconductor layer had a conductivity of 1 to 2 S/cm. Among these Examples, the p-type semiconductor layer in Example 9 had the lowest conductivity of 0.01 S/cm. Moreover, since the gas flow rate ratio ($[B_2H_6]/[SiH_4]$) required for maintaining the same conductivity increased in Examples 4 to 8, it is revealed that the activation efficiency of boron as a dopant decreased with increase in a nitrogen atom concentration, and especially in Example 9 where the nitrogen atom concentration was higher than 10 atomic %, the activation efficiency of boron extremely decreased. For comparison, a single p-type semiconductor layer was formed under conditions that a nitrogen atom concentration was as high as 15 atomic %, which was even higher than the nitrogen atom concentration in Example 9, and the gas flow rate ratio ($[B_2H_6]/[SiH_4]$) was ten times as high as that in Example 9. The obtained p-type semiconductor layer had a conductivity not more than $1 \times 10^{-7}$ S/cm, indicating that this p-type semiconductor layer was almost an insulator. It was found from the above that activation of boron as a dopant in the region where the nitrogen atom concentration in the p-type semiconductor layer is not lower than 10 atomic % is considered to be extremely difficult due to an increase in silicon nitride phase as thus described, which makes it impossible to obtain the electric conductivity required of a p-type semiconductor layer for functioning as it is, and hence conversion efficiency largely decreases. Namely, the nitrogen atom concentration in the p-type semiconductor layer is preferably not higher than 10 atomic % in order that the p-type semiconductor layer may have suitable conductivity and the effect of improving the open-circuit voltage which is produced by addition of nitrogen may be obtained.

It is thought from the above consideration that, in the example embodiment presented herein, especially when the nitrogen atom concentration in the p-type semiconductor layer is in the range from 0.001 to 10 atomic %, the open-circuit voltage increases due to the effect of widening the band gap of the p-type semiconductor layer, the passivation effect of the crystal grind boundary and the p/i layer interface, and the like, and thereby a photoelectric conversion device with high photoelectric conversion efficiency can be obtained.

Further, in Examples 7 and 8, the open-circuit voltage and the fill factor sequentially decreased with increase in the nitrogen atom concentration, as compared to Example 6 where the largest open-circuit voltage was observed. This is presumably caused by an increase in recombination at the p/i layer interface that occurs as follows. As the nitrogen atom concentration in the p-type semiconductor layer is shifted from the low concentration side to get closer to the high concentration region of 10 atomic %, the band gap of the p-type semiconductor layer increases and a discontinuity of a conduction band caused by the difference in band gap of the p/i layer interface becomes significant, thereby to increase the p/i layer interface recombination. This view can be supported by the fact that in FIGS. 3 and 4, the respective open-circuit voltages and short-circuit current densities in Examples 10 to 14, where the second p-type semiconductor layer whose p/i layer interface is added with no nitrogen is provided, are higher than those in Examples 5 to 8 at the corresponding nitrogen atom concentrations. Namely, it is considered that in the region where the nitrogen atom concentration in the first p-type semiconductor layer was not lower than 0.5 atomic %, the discontinuity of the conduction band having occurred on the p/i layer interface could be alleviated by insertion of the second p-type semiconductor layer made of microcrystalline silicon onto the p/i layer interface, leading to reduction in the above interface recombination as well as increases in open-circuit voltage, short-circuit current density, and fill factor, and thereby photoelectric conversion efficiency could be improved. Moreover, a photoelectric conversion device was manufactured by forming the second p-type semiconductor layer added with no nitrogen on the first p-type semiconductor layer added with nitrogen at a concentration of 13 atomic % corresponding to Example 9. As in Example 9, in this photoelectric conversion device, the first p-type semiconductor layer had extremely small electric conductivity, leading to large decreases in open-circuit voltage, short-circuit current density and fill factor, and the photoelectric conversion efficiency decreased to close to zero. It was revealed from this that in a nitrogen atom concentration range of not higher than 10 atomic %, where the first p-type semiconductor layer has sufficiently high electric conductivity, the open-circuit voltage, the short-circuit current density and the fill factor increase by provision of the second p-type semiconductor layer.

According to the above consideration, when the nitrogen atom concentration in the first p-type semiconductor layer is in the range from 0.5 to 10 atomic %, formation of the second p-type semiconductor layer added with no nitrogen enables to reduce recombination at the p/i layer interface, to improve the fill factor and to increase the open-circuit voltage and the short-circuit current density, and thereby the photoelectric conversion efficiency can further be improved.

Next, consideration was made of the short-circuit current density in Examples 1 to 9 and Comparative Example 1. It is found from FIG. 4 that there are little differences in short-circuit current density among Comparative Example 1, Example 1 and Example 2. In each of Examples 3 to 8 where the p-type semiconductor layer was formed such that the nitrogen atom concentration was not lower than 0.01 atomic %, the short-circuit current density exceeded the short-circuit current density of 22.8 mA/cm$^2$ in Comparative Example 1, and it continuously increased with increase in a nitrogen atom concentration up to 10 atomic %. It is therefore considered that, with increase in a nitrogen atom concentration in the p-type semiconductor layer in the region not lower than 0.01 atomic %, a light transmittance of the p-type semiconductor layer as a window layer is improved, to increase the number of photoproduction carriers, resulting in an increase in short-circuit current density. Further, when the light transmittance of the single p-type semiconductor layer in each of Examples 1 to 9 was measured for comparison, the light transmittance was improved with increase in a nitrogen atom concentration. This is presumably because a ratio of the silicon nitride phase having a high light transmittance in the p-type semiconductor layer increases with increase in a nitrogen atom concentration in the p-type semiconductor layer. It became apparent that in Example 9, the short-circuit current density decreases due to a decrease in electric conductivity that accompanies improvement in light transmittance resulted from the increase in silicon nitride phase in the p-type semiconductor layer, whereas as in Examples 1 to 8, a high short-circuit current density can be obtained with nitrogen atom concentration in the region not higher than 10 atomic %.

It is thought from the above consideration that, when the nitrogen atom concentration in the p-type semiconductor layer is in the range from 0.01 to 10 atomic %, in addition to the foregoing improvement of the open-circuit voltage, the light transmittance of the p-type semiconductor layer is improved to increase the short-circuit current density, and thereby a photoelectric conversion device with higher photoelectric conversion efficiency can be obtained.

Next, consideration was made of the comparative results of Examples 6 and 15. In Example 15, an amorphous p-type semiconductor layer added with nitrogen was formed since a small amount of hydrogen for dilution was used during formation of the p-type semiconductor layer. Example 6 differs from Example 15 in that a microcrystalline p-type semiconductor layer added with nitrogen was formed using a large amount of hydrogen for dilution. This was confirmed by observation of measured Raman scattering spectrums of the single p-type semiconductor layers in Examples 6 and 15. A peak in the vicinity of 520 cm$^{-1}$, indicative of the presence of a crystalline silicon phase, was observed in the p-type semiconductor layer in Example 6, whereas such a peak was not observed in the p-type semiconductor layer in Example 15. As described above, the fill factor was 0.705 in Example 15, whereas the fill factor was 0.723 in Example 6, indicating that especially the fill factor largely improved. It is therefore considered that, with the p-type semiconductor layer made of microcrystal, electric conductivity was improved, to reduce series resistance loss of the photoelectric conversion device, leading to increases in open-circuit voltage, short-circuit current density and fill factor, and thereby a photoelectric conversion device with high photoelectric conversion efficiency could be obtained.

Example 16

In the present example, the superstrate laminated type photoelectric conversion device shown in FIG. 2 was manufactured in the following manner.

As the substrate 11, a white glass constituted by forming a transparent conductive film on the same surface as those used in above Examples 1 to 15, was used. On this substrate 11, a zinc oxide layer having a thickness of 50 nm was formed by magnetron sputtering. Subsequently, under below-mentioned conditions, a first photoelectric conversion layer 10 was deposited by plasma CVD in the order of the p-type semiconductor layer 12, the i-type semiconductor layer 13 and the n-type semiconductor layer 14. On this first photoelectric conversion layer 10, under the below-mentioned conditions, a second photoelectric conversion layer 20 was further deposited by plasma CVD in the order of a p-type semiconductor layer 22, an i-type semiconductor layer 23 and an n-type semiconductor layer 24. Thereafter, on the second photoelectric conversion layer 20, a zinc oxide layer having a thickness of 50 nm as the transparent conductive layer 15, and a silver layer having a thickness of 500 nm as the electrode 16 were sequentially deposited by magnetron sputtering, to obtain a superstrate laminated type photoelectric conversion device 200.

The $N_2$ gas was not used in formation of the p-type semiconductor layer 12 of the first photoelectric conversion layer 10. Meanwhile, the $N_2$ gas was used in formation of the p-type semiconductor layer 22 of the second photoelectric conversion layer 20. In formation of the p-type semiconductor layer 12, $SiH_4$, $H_2$ and $B_2H_6$ were used as raw material gases. A gas flow rate ratio ($[H_2]/[SiH_4]$) was 5, and a gas flow rate ratio ($[B_2H_6]/[SiH_4]$) was adjusted such that the boron concentration in the layer was 0.1 atomic %.

The thickness of the p-type semiconductor layer 12 was 15 nm.

In formation of the i-type semiconductor layer 13, $SiH_4$ and $H_2$ were used as raw material gases. A gas flow rate ratio ($[H_2]/[SiH_4]$) was 20, and the layer was formed so as to have a thickness of 300 nm.

In formation of the n-type semiconductor layer 14, $SiH_4$, $H_2$ and $PH_3$ were used as raw material gases. A gas flow rate ratio ($[H_2]/[SiH_4]$) was 20, and a gas flow rate ratio ($[PH_3]/[SiH_4]$) was adjusted such that the phosphorous atom concentration in the layer was 0.01 atomic %. The thickness of the n-type semiconductor layer 14 was 20 nm.

It should be noted that the substrate temperature was 200° C. during formation of the p-type semiconductor layer 12, the i-type semiconductor layer 13 and the n-type semiconductor layer 14 by plasma CVD.

The p-type semiconductor layer 22, the i-type semiconductor layer 23 and the n-type semiconductor layer 24 of the second photoelectric conversion layer 20 were formed under the same conditions to have the same thicknesses as in formation of the p-type semiconductor layer 12, the i-type semiconductor layer 13 and the n-type semiconductor layer 14 in Example 6, respectively. Therefore, the nitrogen atom concentration in the p-type semiconductor layer 22 was 2 atomic %.

Current-voltage characteristics per 1 $cm^2$ cell area of the photoelectric conversion device thus obtained were measured under an irradiation condition of AM 1.5 (100 $mW/cm^2$), and the measurement results were shown in Table 2.

Example 17

The superstrate laminated type photoelectric conversion device 200 was manufactured under the same conditions as in Example 16 except for conditions for forming the p-type semiconductor layer 12. In the present example, the $N_2$ gas was used in formation of the p-type semiconductor layers 12 and 22 of the first and second photoelectric conversion devices 10 and 20. In formation of the p-type semiconductor layer 12, a gas flow rate ratio ($[H_2]/[SiH_4]$) was 5, a gas flow rate ratio ($[B_2H_6]/[SiH_4]$) was adjusted such that the boron concentration in the layer was 0.01 atomic %, and a gas flow rate ratio ($[N_2]/[SiH_4]$) was adjusted such that the nitrogen atom concentration in the layer was 2 atomic %. As in the above examples, current-voltage characteristics per 1 $cm^2$ cell area of the photoelectric conversion device thus obtained were measured under an irradiation condition of AM 1.5 (100 $mW/cm^2$), and the measurement results were shown in Table 2.

Comparative Example 2

The superstrate laminated type photoelectric conversion device 200 was manufactured under the same conditions as in Example 16 except for conditions for forming the p-type semiconductor layer 22. In the present comparative example, the $N_2$ gas was not used in formation of the p-type semiconductor layers 12 and 22 of the first and second photoelectric conversion layers 10 and 20. In formation of the p-type semiconductor layer 22, a gas flow rate ratio ($[H_2]/[SiH_4]$) was 150, a gas flow rate ratio ($[B_2H_6]/[SiH_4]$) was adjusted such that the boron concentration in the layer was 0.01 atomic %. As in the above examples, current-voltage characteristics per 1 $cm^2$ cell area of the photoelectric conversion device as thus obtained were measured under an irradiation condition of AM 1.5 (100 $mW/cm^2$), and the measurement results were shown in Table 2.

TABLE 2

|  | 2-1 | 2-2 | 2-3 | 2-4 |
|---|---|---|---|---|
| Example 16 | 1.465 | 12.21 | 0.740 | 13.24 |
| Example 17 | 1.498 | 12.49 | 0.742 | 13.88 |
| C. Example 2 | 1.396 | 11.77 | 0.738 | 12.13 |

2-1: Open-circuit voltage [V]
2-2: Short-circuit current density [mA/cm²]
2-3: Fill factor
2-4: Photoelectric conversion efficiency [%]

Consideration of Examples 16 and 17, and Comparative Example 2

In the following, consideration was made of the comparative results of Examples 16 and 17, and Comparative Example 2, based upon Table 2.

In Example 16 where the p-type semiconductor layer of the second photoelectric conversion layer contained 2 atomic % of nitrogen atoms, the open-circuit voltage and the short-circuit current density were large and high photoelectric conversion efficiency was obtained, as compared to Comparative Example 2 where the p-type semiconductor layers of the first and second photoelectric conversion layers contained almost no nitrogen atoms. This is presumably because the second photoelectric conversion layer 20 had the effects of improving the open-circuit voltage and the short-circuit current density which are the same as those in Examples 2 to 8.

Further, in Example 17 where the p-type semiconductor layers of the first and second photoelectric conversion layers both contain 2 atomic % of nitrogen atoms, the first photoelectric conversion layer, as well as the second photoelectric conversion layer, had the effects of improving the open-circuit voltage and the short-circuit current density, and the high photoelectric conversion efficiency as compared to Example 16.

According to the above consideration, application of the example embodiment to at least one p-type semiconductor layer of a laminated type photoelectric conversion device leads to an increase in open-circuit voltage and short-circuit current density, and thereby photoelectric conversion efficiency can be improved, as in the case of the above-mentioned single-layer type photoelectric conversion device.

Examples 18 to 35 and Comparative Examples 3 to 13

In Examples 18 to 35 and Comparative Examples 3 to 13, the superstrate type photoelectric conversion device 100 shown in FIG. 1 was manufactured as follows.

As the substrate 11, a white glass board (product name "Asahi-U", manufactured by ASAHI GLASS CO., LTD.) was used which had dimensions of 127 mm (length)×127 mm (width)×1.8 mm (thickness) and was constituted by forming the transparent conductive film 11b on the surface of the light permeable substrate 11a. On this substrate 11, a zinc oxide layer having a thickness of 50 nm was formed by magnetron sputtering. Thereafter, under below-mentioned conditions, the photoelectric conversion layer 10 was deposited by plasma CVD in the order of the p-type semiconductor layer 12, the i-type semiconductor layer 13 and the n-type semiconductor layer 14. It is to be noted that a plasma CVD system used for formation of the photoelectric conversion layer 10 was an ultra-high vacuum system capable of forming a high quality photoelectric conversion layer where a very few amount of impurity elements was mixed.

Each of the layers constituting the photoelectric conversion layer 10 was formed under the following conditions.

In Examples 18 to 35 and Comparative Examples 3 to 13, $SiH_4$, $H_2$, $B_2H_6$ and $N_2$ were used as raw material gases in formation of the p-type semiconductor layer 12. A gas flow rate ratio ($[H_2]/[SiH_4]$), a gas flow rate ratio ($[B_2H_6]/[SiH_4]$), and a gas flow rate ratio ($[N_2]/[SiH_4]$) were changed as shown in Table 3, and the nitrogen atom concentration and the boron atom concentration in the layer at those changed gas flow rate ratios were put down in Table 3 along with the ratios. It is to be noted that the nitrogen atom concentration and the boron atom concentration, relative to silicon atoms, in the formed p-type semiconductor layer 12 are values (atomic %) obtained as a result of sensitive secondary ion mass spectrometry and Auger electron spectroscopy. In order to increase an amount of light incident on the i-type semiconductor layer as a photoactive layer, the p-type semiconductor layer 12 desirably has as small a thickness as possible within the bounds of not impairing its function. In the present examples and comparative examples, the thickness of the p-type semiconductor layer 12 was 20 nm, and the gas flow rate ratio ($[H_2]/[SiH_4]$) was adjusted such that the intensity ratio was not less than 3 (Ic/Ia≧3). It should be noted that in each of the present examples and comparative examples, a substrate temperature was 170° C. during formation of the p-type semiconductor layer by CVD.

In formation of the i-type semiconductor layer 13, $SiH_4$ and $H_2$ gas were used as raw material gases. A gas flow rate ratio ($[H_2]/[SiH_4]$) was 80, and the film-forming time was adjusted such that the layer was formed as microcrystalline silicon having a thickness of 2,500 nm. It should be noted that in each of the present examples and comparative examples, a substrate temperature was 180° C. during formation of the i-type semiconductor layer by CVD.

In formation of the n-type semiconductor layer 14, $SiH_4$, $H_2$ and $PH_3$ gas were used as raw material gases. A gas flow rate ratio ($[H_2]/[SiH_4]$) was 20, and a gas flow rate ratio ($[PH_3]/[SiH_4]$) was adjusted such that the phosphorous atom concentration in the layer was 0.01 atomic %, and the film was formed so as to have a thickness of 20 nm. It should be noted that in each of the present examples and comparative examples, a substrate temperature was 160° C. during formation of the n-type semiconductor layer by CVD.

Next, the photoelectric conversion layer 10 after formation was heat-treated at 200° C. in a nitrogen atmosphere for one hour.

Subsequently, on the photoelectric conversion layer 10, the zinc oxide layer having a thickness of 50 nm as the transparent conductive layer 15, and the silver layer having a thickness of 500 nm as the electrode 16 were sequentially deposited by magnetron sputtering, to obtain a superstrate type photoelectric conversion device 100.

Current-voltage characteristics per 1 $cm^2$ cell area of each of the photoelectric conversion devices of Examples 18 to 35 and Comparative Examples 3 to 13 as thus obtained were measured under an irradiation condition of AM 1.5 (100 $mW/cm^2$), conversion efficiencies obtained as a result of the measurement were summarized in Table 3. In particular dependency of a proper boron concentration on the nitrogen atom concentration was shown in FIG. 5. The boron atom concentration is indicated with two significant digits, and the boron atom concentration calculated by Relational formula 1: $0.11-0.009A+0.042A^2 \leq B \leq 0.2+0.2A+0.05A^2$, is also indicated with two significant digits.

TABLE 3

|  | 3-1 | 3-2 | 3-3 | 3-4 | 3-5 | 3-6 | 3-7 |
| --- | --- | --- | --- | --- | --- | --- | --- |
| Example 18 | 0.002 | 0.033 | 130 | 110 | 0.01 | 0.11 | 8.6 |
| Example 19 | 0.002 | 0.042 | 130 | 100 | 0.01 | 0.14 | 8.7 |
| Example 20 | 0.002 | 0.054 | 130 | 90 | 0.01 | 0.18 | 8.6 |
| Example 21 | 0.02 | 0.033 | 150 | 220 | 0.1 | 0.11 | 8.8 |
| Example 22 | 0.02 | 0.045 | 150 | 150 | 0.1 | 0.15 | 9.0 |
| Example 23 | 0.02 | 0.06 | 150 | 120 | 0.1 | 0.20 | 8.9 |
| Example 24 | 0.2 | 0.042 | 180 | 230 | 1 | 0.14 | 9.2 |
| Example 25 | 0.2 | 0.09 | 200 | 170 | 1 | 0.30 | 9.5 |
| Example 26 | 0.2 | 0.135 | 200 | 150 | 1 | 0.45 | 9.3 |
| Example 27 | 0.8 | 0.225 | 270 | 210 | 4 | 0.75 | 9.7 |
| Example 28 | 0.8 | 0.39 | 300 | 180 | 4 | 1.30 | 10.1 |
| Example 29 | 0.8 | 0.54 | 310 | 160 | 4 | 1.80 | 9.9 |
| Example 30 | 1.6 | 0.75 | 450 | 200 | 8 | 2.70 | 9.1 |
| Example 31 | 1.6 | 1.2 | 500 | 170 | 8 | 4.00 | 10.0 |
| Example 32 | 1.6 | 1.5 | 550 | 150 | 8 | 5.00 | 9.7 |
| Example 33 | 3.0 | 3.0 | 650 | 240 | 15 | 10.0 | 8.9 |
| Example 34 | 3.0 | 3.6 | 700 | 190 | 15 | 12.0 | 10.0 |
| Example 35 | 3.0 | 4.2 | 900 | 170 | 15 | 14.0 | 9.8 |
| C. Example 3 | — | 0.03 | 120 | 100 | 0.0002 | 0.10 | 8.5 |
| C. Example 4 | 0.02 | 0.03 | 130 | 320 | 0.1 | 0.10 | 8.0 |
| C. Example 5 | 0.02 | 0.075 | 140 | 130 | 0.1 | 0.25 | 8.4 |
| C. Example 6 | 0.2 | 0.039 | 140 | 310 | 1 | 0.13 | 7.9 |
| C. Example 7 | 0.2 | 0.165 | 150 | 130 | 1 | 0.55 | 8.2 |
| C. Example 8 | 0.8 | 0.195 | 250 | 350 | 4 | 0.65 | 8.3 |
| C. Example 9 | 0.8 | 0.6 | 330 | 150 | 4 | 2.00 | 8.5 |
| C. Example 10 | 1.6 | 0.6 | 450 | 350 | 8 | 2.00 | 8.3 |
| C. Example 11 | 1.6 | 1.8 | 600 | 140 | 8 | 6.00 | 8.4 |
| C. Example 12 | 3.0 | 2.7 | 620 | 370 | 15 | 9.00 | 8.2 |
| C. Example 13 | 3.0 | 4.8 | 1000 | 160 | 15 | 16.0 | 8.5 |

3-1: Gas flow rate ratio ($[N_2]/[SiH_4]$)
3-2: Gas flow rate ratio ($[B_2H_6]/[SiH_4]$)
3-3: Gas flow rate ratio ($[H_2]/[SiH_4]$)
3-4: Sheet resistance (kΩ/□)
3-5: Nitrogen atom concentration in the p-type semiconductor layer [atomic %]
3-6: Boron atom concentration in the p-type semiconductor layer [atomic %]
3-7: Photoelectric conversion efficiency [%]

Consideration of Examples 18 to 35 and Comparative Examples 3 to 13

In the following, consideration was made of the results of Examples 18 to 35 and Comparative Examples 3 to 13, based upon Table 3 and FIG. 5. It is to be noted that in FIG. 5, the results of Examples 18 to 35 were indicated with the mark "●", while the results of Comparative Examples 3 to 13 were indicated with the mark "Δ".

In each of Examples 18 to 35, the p-type semiconductor layer was produced by controlling the boron atom concentration when nitrogen atom concentration and the boron atom concentration in the p-type semiconductor layer are gradually increased such that a sheet resistance is not more than 300 kΩ/□ with the thickness of the layer being 50 nm. However, the sheet resistance is a value obtained after heat treatment in the nitrogen atmosphere at 200° C. for one hour. FIG. 5 shows the correlation between nitrogen atom concentration and the boron atom concentration in the p-type semiconductor layer.

Figure 5:
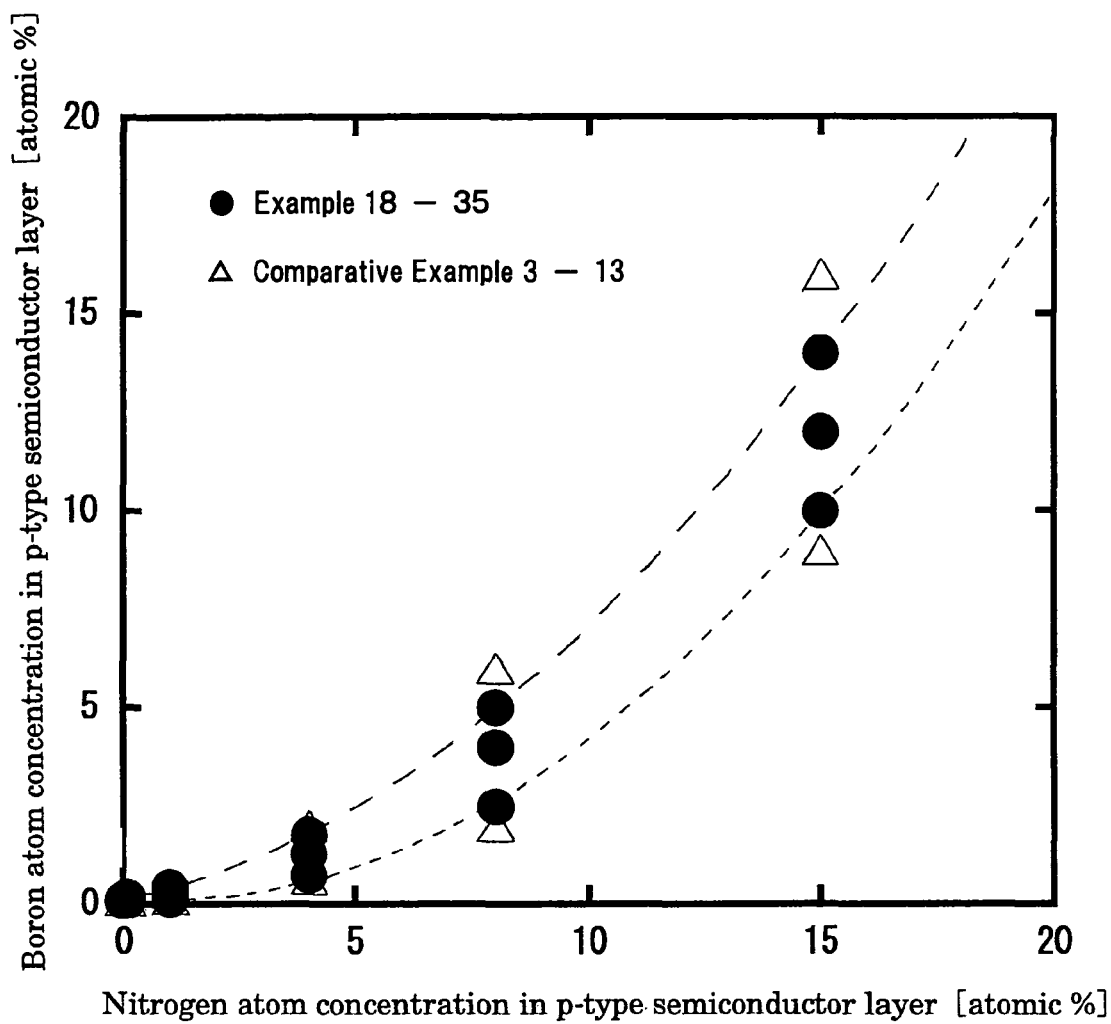
FIG. 5 is a graph showing dependency of a proper boron concentration on a nitrogen atom concentration in Examples 18 to 35 and Comparative Examples 3 to 13.

The present inventors performed fitting to FIG. 5 (two significant digits) and as a result found that the sheet resistance of not more than 300 kΩ/□ can be achieved when the nitrogen atom concentration A (atomic %) and the boron atom concentration B (atomic %) have a correlation expressed by the formula: $B \geq 0.11-0.009A+0.042A^2$ (Relational formula 2). As a result of applying a p-type conductivity layer having such a correlation to the photoelectric conversion device, it became obvious that, with gradual increase in nitrogen atomic concentration, photoelectric conversion efficiency is improved until nitrogen atom concentration becomes 4 atomic %, and thereafter photoelectric conversion efficiency remains relatively high until the nitrogen atom concentration becomes 15 atomic %. The reason for this is considered as below.

With the p-type semiconductor layer containing nitrogen atoms, the open-circuit voltage is improved due to the effects including: (a) a band gap of the p-type semiconductor layer widens and a diffusion potential thus increases; and (b) passivation of the crystal grain boundary interface as well as passivation of the p/i layer interface is produced by addition of nitrogen atoms, to reduce the interface recombination. Herein, the boron atom concentration is increased so as to compensate for a decrease in activation efficiency of boron, with increase in a nitrogen atom concentration, which prevents the carrier concentration in the p-type semiconductor layer from decreasing even when a nitrogen atom concentration is high. It is therefore thought that the open-circuit voltage and photoelectric conversion efficiency are improved even when nitrogen atom concentration is high. Next, considering the comparative example where the boron atom concentration B is below a value satisfying above Relational formula 1, the sheet resistance exceeds 300 kΩ/□ and the carrier concentration thus becomes insufficient, leading to a decrease in diffusion potential, and thereby conversion efficiency is decreased. It can therefore be said that one of the conditions for obtaining high conversion efficiency is that the boron atom concentration B (atomic %) satisfies Relational formula 2.

Meanwhile, as a result of performing fitting to FIG. 5 (two significant digits), it became clear that high conversion efficiency can be obtained when the nitrogen atom concentration A (atomic %) and the boron atom concentration B (atomic %) have a correlation expressed by the formula: $B \leq 0.2+0.2A+0.05A^2$ (Relational formula 3).

Namely, when the boron concentration exceeds a value satisfying Relational formula 3, the conversion efficiency decreased despite of sufficiently low sheet resistance. This is presumably because defects in the p-type semiconductor layer or the p/i interface increase with increase in a boron atom concentration. It is known that the higher the hydrogen covering ratio of a growth surface is, the less defects a formed layer has. However, boron chemically increases defects for taking out hydrogen from the growth surface. In the present examples and comparative examples, the gas flow rate ratio ($[H_2]/[SiH_4]$) is increased simultaneously with increase in boron atom concentration in order to maintain the ratio of the crystalline phase. However, the gas flow rate ratio ($[H_2]/[SiH_4]$) required for suppressing the increase in defects due to the increase in a boron concentration is larger than the gas flow rate ratio ($[H_2]/[SiH_4]$) required for maintaining the ratio of the crystalline phase. It is therefore considered as difficult to suppress the increase in defects and maintain the ratio of the crystalline silicon at the same time.

It became apparent that high conversion efficiency can be obtained from above Relational formula 2 and 3 that, when the nitrogen atom concentration A (atomic %) and the boron atom concentration B (atomic %) in the p-type semiconductor layer have the correlation expressed by foregoing Relational formula 1: $0.11-0.009A+0.042A^2 \leq B \leq 0.2+0.2A+0.05A^2$.

Further, in Examples 18 to 35 where above Referential formula 1 is satisfied, the nitrogen atom concentration is from 0.01 to 15 atomic % relative to silicon atoms, and the conversion efficiency is from 8.6 to 10.1%, whereas in Comparative Examples 3 to 13 where above Relational formula 1 is not satisfied, the nitrogen atom concentration is 0.0002 to 15 atomic % relative to silicon atoms, and the conversion efficiency is from 7.9 to 8.5%. It can therefore be said that after above Relational formula 1 is satisfied, the nitrogen atom concentration, relative to silicon atoms, is preferably from 0.01 to 15 atomic %, and more preferably from 4 to 15 atomic %, as the optimum value.

Examples 36 to 52 and Comparative Examples 14 to 16

Examples 36 to 43

In Examples 36 to 43, the superstrate type photoelectric conversion device 100 shown in FIG. 1 was manufactured as follows.

As the substrate 11, a white glass board (product name "Asahi-U", manufactured by ASAHI GLASS CO., LTD.) was used which had dimensions of 127 mm (length)×127 mm (width)×1.8 mm (thickness) and was constituted by forming the transparent conductive film 11b on the surface of the light permeable substrate 11a. On this substrate 11, a zinc oxide layer having a thickness of 50 nm was formed by magnetron sputtering. Thereafter, under below-mentioned conditions, the photoelectric conversion layer 10 was deposited by plasma CVD in the order of the p-type semiconductor layer 12, the i-type semiconductor layer 13 and the n-type semiconductor layer 14. A plasma CVD system used for formation of the photoelectric conversion layer 10 was an ultra-high vacuum system capable of forming a high-quality photoelectric conversion layer where a very few amount of impurity elements was mixed. Subsequently, on the photoelectric conversion layer 10, the zinc oxide layer having a thickness of 50 nm as the transparent conductive layer 15, and the silver layer having a thickness of 500 nm as the electrode 16 were sequentially deposited by magnetron sputtering, to obtain a superstrate type photoelectric conversion device 100.

Each of the layers constituting the photoelectric conversion layer 10 was formed under the following conditions.

In formation of the p-type semiconductor layer 12, $SiH_4$, $H_2$ and $B_2H_6$ gas were used as raw materials gases. A gas flow rate ratio ($[H_2]/[SiH_4]$) was 150, and a gas flow rate ratio ($[B_2H_6]/[SiH_4]$) was 0.003. In order to increase an amount of light incident on the i-type semiconductor layer as a photo-active layer, the p-type semiconductor layer 12 desirably has as small a thickness as possible within the bounds of not impairing its function as a p-type layer, and in the present examples, the thickness of the p-type semiconductor layer 12 was 20 nm.

In formation of the i-type semiconductor layer 13, $SiH_4$ and $H_2$ gas were used as raw material gases. A gas flow rate ratio ($[H_2]/[SiH_4]$) was 80, and the layer was formed so as to have a thickness of 2,500 nm.

In formation of the n-type semiconductor layer 14, $SiH_4$, $H_2$, $PH_3$ and $N_2$ gas were used as raw material gases. A gas flow rate ratio ($[H_2]/[SiH_4]$) was 100, a gas flow rate ratio ($[PH_3]/[SiH_4]$) was changed as shown in Table 1, and a gas flow rate ratio ($[N_2]/[SiH_4]$) was also changed as shown in Table 1. The nitrogen atom concentrations in the layer at those changed gas flow rate ratios were put down in Table 1 along with the ratios. It is to be noted that the nitrogen atom concentration in the layer is a value (atomic %) obtained as a result of performing sensitive secondary ion mass spectrometry on the n-type semiconductor layer 14. In Raman scattering spectrum of single n-type semiconductor layers 14 in the present examples, a peak of crystalline silicon in the vicinity of 520 cm$^{-1}$, attributed to silicon-silicon bonding, was observed, and it was thereby confirmed that the n-type semiconductor layer of the present embodiment has a crystalline silicon phase. Further, in each of the examples, a peak height (Ic) of the crystalline silicon to a peak height (Ia) of amorphous silicon of the vicinity of 480 cm$^{-1}$ was not less than 3. In order to increase an amount of light re-incident on the i-type semiconductor layer 13 as a photoactive layer from the underside electrode 16, the n-type semiconductor layer 14 desirably has as small a thickness as possible within the bounds of not impairing its function as an n-type layer, and in the present examples, the thickness of the n-type semiconductor layer 14 was 20 nm.

It should be noted that the substrate temperatures in formation of the n-type semiconductor layer 12, the i-type semiconductor layer 13 and the n-type semiconductor layer 14 by plasma CVD, were 170° C., 180° C. and 160° C., respectively.

Current-voltage characteristics per 1 cm$^2$ cell area of each of the photoelectric conversion devices of Examples 36 to 43 as thus obtained were measured under an irradiation condition of AM 1.5 (100 mW/cm$^2$), and the measurement results were summarized in Table 4. In particular, dependency of an open-circuit voltage on nitrogen atom concentration was shown in FIG. 6, dependency of a short-circuit current density on the nitrogen atom concentration was shown in FIG. 7, and dependency of photoelectric conversion efficiency on the nitrogen atom concentration was shown in FIG. 8.

Examples 44 to 46

In Examples 44 to 46, the superstrate type photoelectric conversion device 100 was manufactured in the following manner under the same conditions as in Examples 41 to 43 except for conditions for forming the n-type semiconductor layer 14.

The n-type semiconductor layer 14 was formed by forming a first n-type semiconductor layer, containing no nitrogen, and depositing a second n-type semiconductor layer, containing nitrogen atoms at the same concentration as that in each of Examples 41 to 43, on the first n-type semiconductor layer. In formation of the first n-type semiconductor layer, $SiH_4$, $H_2$ and $PH_3$ gas were used as raw material gases. A gas flow rate ratio ($[H_2]/[SiH_4]$) was 70, and a gas flow rate ratio ($[PH_3]/[SiH_4]$) was 0.001. In Raman scattering spectrums of the single first n-type semiconductor layers in the present examples, a peak of crystalline silicon in the vicinity of 520 cm$^{-1}$ was observed, and it was thereby confirmed that the first n-type semiconductor layers of Examples 44 to 46 have crystalline silicon phases. The second n-type semiconductor layer was formed under the same conditions as Examples 41 to 43 as shown in Table 4. The thicknesses of the first and second n-type semiconductor layers were 10 nm and 15 n, respectively.

Current-voltage characteristics per 1 cm$^2$ cell area of the photoelectric conversion devices of Examples 44 to 46 as thus obtained were measured under an irradiation condition of AM 1.5 (100 mW/cm$^2$), and the measurement results were shown in Table 4 and FIGS. 6 to 8, as in Examples 36 to 43.

Example 47

In Example 47, the superstrate type photoelectric conversion device 100 was manufactured in the following manner under the same conditions as in Example 41 except that the gas flow rate ratio ($[H_2]/[SiH_4]$) was 20 in formation of the n-type semiconductor layer 14. Namely, the nitrogen atom concentration of the n-type semiconductor layer in Example 47 was 2 atomic %, as shown in Table 4. In Raman scattering spectrum of the single n-type semiconductor layer of the present example, a peak of crystalline silicon in the vicinity of 520 cm$^{-1}$ was not observed, and it was thereby confirmed that the n-type semiconductor layer of the present example was made of amorphous silicon.

Current-voltage characteristics per 1 cm$^2$ cell area of the photoelectric conversion device of Example 47 as thus obtained were measured under an irradiation condition of AM 1.5 (100 mW/cm$^2$), and the measurement results were shown in Table 4, and FIGS. 6 to 8, as in Examples 36 to 43.

Comparative Example 14

In Comparative Example 14, the superstrate type photoelectric conversion device 100 was manufactured in the following manner under the same conditions as in Examples 36 to 43 except for conditions for forming the n-type semiconductor layer 14.

The n-type semiconductor layer 14 was formed under the same conditions as those of Examples 36 to 43 except that $SiH_4$, $H_2$ and $PH_3$ gas were used as raw material gases, a gas flow rate ratio ($[H_2]/[SiH_4]$) was 20, and a gas flow rate ratio ($[PH_3]/[SiH_4]$) was adjusted such that the phosphorous atom concentration in the layer was 0.01 atomic %. In Raman scattering spectrums of the n-type semiconductor layer of Comparative Example 14, a peak of crystalline silicon in the vicinity of 520 cm$^{-1}$ was not observed, and it was thereby confirmed that the n-type semiconductor layer 14 of Comparative Example 14 was made of amorphous silicon.

Current-voltage characteristics per 1 cm$^2$ cell area of the photoelectric conversion device of Comparative Example 14 as thus obtained were measured under an irradiation condition of AM 1.5 (100 mW/cm$^2$), and the measurement results were shown in Table 4 and FIGS. 6 to 8, as in Examples 36 to 43.

Comparative Example 15

In Comparative Example 15, the superstrate type photoelectric conversion device 100 was manufactured in the following manner under the same conditions as in Examples 36 to 43 except for conditions for forming the n-type semiconductor layer 14.

The n-type semiconductor layer 14 was formed under the same conditions as those of Examples 36 to 43 except that a gas flow rate ratio ([PH$_3$]/[SiH$_4$]) and a gas flow rate ratio ([N$_2$]/[SiH$_4$]) are as shown in Table 4.

Current-voltage characteristics per 1 cm$^2$ cell area of the photoelectric conversion device of Comparative Example 15 as thus obtained were measured under an irradiation condition of AM 1.5 (100 mW/cm$^2$), and the measurement results were shown in Table 4. The open-circuit voltage, short-circuit current density and photoelectric conversion efficiency of Comparative Examples 15 are shown in FIG. 4, but not shown in FIGS. 6 to 8 because those values were extremely low.

TABLE 4

|  | 4-1 | 4-2 | 4-3 | 4-4 | 4-5 | 4-6 | 4-7 |
|---|---|---|---|---|---|---|---|
| C. Example 14 | 0 | 0.0125 | 0.0002 | 0.500 | 21.80 | 0.710 | 7.74 |
| Example 36 | 0.0001 | 0.0125 | 0.0005 | 0.501 | 21.80 | 0.711 | 7.77 |
| Example 37 | 0.0002 | 0.0125 | 0.001 | 0.505 | 21.81 | 0.710 | 7.82 |
| Example 38 | 0.002 | 0.0125 | 0.01 | 0.511 | 21.88 | 0.713 | 7.97 |
| Example 39 | 0.02 | 0.014 | 0.1 | 0.518 | 22.04 | 0.720 | 8.22 |
| Example 40 | 0.1 | 0.016 | 0.5 | 0.525 | 22.16 | 0.723 | 8.41 |
| Example 41 | 0.4 | 0.020 | 2 | 0.543 | 22.31 | 0.720 | 8.72 |
| Example 42 | 0.8 | 0.022 | 4 | 0.531 | 22.42 | 0.719 | 8.56 |
| Example 43 | 2 | 0.025 | 10 | 0.524 | 22.47 | 0.682 | 8.03 |
| C. Example 15 | 2.6 | 0.028 | 13 | 0.464 | 10.04 | 0.117 | 0.55 |
| Example 44 | 0.4 | 0.020 | 2 | 0.544 | 22.35 | 0.723 | 8.80 |
| Example 45 | 0.8 | 0.022 | 4 | 0.550 | 22.48 | 0.723 | 8.94 |
| Example 46 | 2 | 0.025 | 10 | 0.535 | 22.51 | 0.722 | 8.69 |
| Example 47 | 0.4 | 0.020 | 2 | 0.516 | 22.29 | 0.681 | 7.83 |

4-1: Gas flow rate ratio ([N$_2$]/[SiH$_4$])
4-2: Gas flow rate ratio ([PH$_3$]/[SiH$_4$])
4-3: Nitrogen atom concentration in the n-type semiconductor layer [atomic %]
4-4: Open-circuit voltage [V]
4-5: Short-circuit current density [mA/cm$^2$]
4-6: Fill factor
4-7: Photoelectric conversion efficiency [%]

Consideration of Examples 36 to 46 and Comparative Examples 14 to 15

In the following, consideration was made of the comparative results of Examples 36 to 46 and Comparative Examples 14 to 15, based upon Table 4 and FIG. 6.

The n-type semiconductor layer of Comparative Example 14, having been formed without using the N$_2$ gas, contained nitrogen at a concentration of 0.0002 atomic %. This indicates that a nitrogen impurity, present due to degassing or in a remaining gas in the vacuum chamber of the plasma CVD system used in Examples 36 to 43, is mixed in a trace amount into the n-type semiconductor layer during formation of the layer. However, since the plasma CVD system is an ultra-high vacuum system, above Comparative Example 14 is regarded as having the smallest amount of impurity nitrogen in the n-type semiconductor layer, and compared to other Examples and Comparative Examples based upon such a regard.

In Example 36 where the nitrogen atom concentration was lower than 0.001 atomic %, the open-circuit voltage was not much different from that in Comparative Example 14. This is presumably because the nitrogen atom concentration in Example 36 was a value with which neither effects produced by addition of nitrogen, the effect of increasing the band gap nor the passivation effect of the crystal grain boundary and the p/i layer interface, could be obtained. In Examples 37 to 43 where the n-type semiconductor layer was formed such that the nitrogen atom concentration was not lower than 0.001 atomic %, any of the respective open-circuit voltages obtained exceeded the open-circuit voltage of 0.5 V in Comparative Example 14. Especially in Example 41, the largest effect of improving the open-circuit voltage was exerted to obtain an open-circuit voltage of 0.543 V Namely, the nitrogen atom concentration in the n-type semiconductor layer is preferably not lower than 0.001 atomic % for improving the open-circuit voltage.

In Comparative Example 15 where nitrogen atom concentration was 13 atomic %, the open-circuit voltage was 0.464 V, which was a large decrease from the open-circuit voltage of Comparative Example 14. In addition to this, the short-circuit current density and the fill factor also largely decreased, and the photoelectric conversion efficiency decreased to close to zero. It is thereby considered that excessive addition of nitrogen to the n-type semiconductor layer caused an increase in ratio of a silicon nitride phase as an insulator, to decrease electric conduction, and thereby the photoproduction carrier collecting efficiency extremely decreased.

Further, in each of Examples 36 to 43 and Comparative Example 14, the gas flow rate ratio ([PH$_3$]/[SiH$_4$]) was controlled such that the n-type semiconductor layer had a conductivity of 1 to 2×10$^{-3}$ S/cm. However, n-type semiconductor layer in Comparative Example 15 had a conductivity of 1×10$^{-6}$ S/cm, which is lower than those in the above examples. Moreover, since the gas flow rate ratio ([PH$_3$]/[SiH$_4$]) required for maintaining the same conductivity increased in Examples 39 to 43, it is revealed that the activation efficiency of phosphorous as a dopant decreased with increase in the nitrogen atom concentration, and especially in Comparative Example 15 where the nitrogen atom concentration was higher than 10 atomic %, the activation efficiency of phosphorous extremely decreased. For comparison, a single n-type semiconductor layer was formed under conditions that a nitrogen atom concentration was as high as 20 atomic %, which was even higher than nitrogen atom concentration in Comparative Example 15, and the gas flow rate ratio ([PH$_3$]/[SiH$_4$]) was ten times as high as that in Comparative Example 15. The obtained n-type semiconductor layer had a conductivity not more than 1×10$^{-7}$ S/cm, indicating that this n-type semiconductor layer was almost an insulator. It was found from the above that activation of phosphorous as a dopant in the region where the nitrogen atom concentration in the n-type semiconductor layer is not lower than 10 atomic % is considered to be extremely difficult due to an increase in silicon nitride phase as thus described, which makes it impossible to obtain the electric conductivity required of an n-type semiconductor layer for functioning as it is, and hence conversion efficiency largely decreases. Namely, the nitrogen atom concentration in the n-type semiconductor layer is preferably not higher than 10 atomic % in order that the n-type semiconductor layer may have suitable conductivity and the effect of improving the open-circuit voltage which is produced by addition of nitrogen may be obtained.

It is thought from the above consideration that, in the example embodiment presented herein, especially when the nitrogen atom concentration in the n-type semiconductor layer is in the range from 0.001 to 10 atomic %, the open-circuit voltage increases due to the effect of widening the band gap of the n-type semiconductor layer, the passivation effect of the crystal grind boundary and the i/n layer interface, and the like, and thereby a photoelectric conversion device with high photoelectric conversion efficiency can be obtained.

Further, in Examples 42 and 43, the open-circuit voltage and the fill factor sequentially decreased with increase in a nitrogen atom concentration, as compared to Example 41 where the largest open-circuit voltage was observed. The reason for this is considered below. It is thought that, as the nitrogen atom concentration in the n-type semiconductor layer is shifted from the low concentration side to get closer to the high concentration region of 10 atomic %, the band gap of the n-type semiconductor layer increases and a discontinuity of a valence band caused by the difference in band gap of the i/n layer interface becomes significant. Herein, when interface recombination through defects of the i/n layer interface is negligibly small, the presence of discontinuity of the valence band, namely a barrier for blocking diffusion of positive holes from the i-layer to the n-layer leads to a decrease in probability of presence of the positive holes in proximity to the i/n layer interface, and accompanied with this, a recombination reduction effect can be obtained. However, as generally known, defects are present in the p/i layer interface or the i/n layer interface in an actual microcrystalline solar cell or an amorphous solar cell, and in Examples 42 and 43, the open-circuit voltage and the fill factor are thought to decrease due to recombination through the defect of the i/n layer interface that increases with increase in discontinuities of the valence band. Therefore, in order to reduce recombination through the defect, the presence of the internal electric field is considered as important which serves to make photocarriers difficult to trap with the defect in proximity to the interface and thus be effectively collected. It is considered that, as means for realizing this, a layer having a band gap for alleviating the discontinuity of the valence band from the i-layer to the n-layer may be inserted onto the i/n layer interface, to apply the internal electric field to the entire inserted interface layer, thereby improving correction of photocarriers. This view can be supported by the fact that in FIGS. 6 and 7, the respective open-circuit voltages and short-circuit current densities in Examples 44 to 46, where the first n-type semiconductor layer has an i/n layer interface added with no nitrogen is provided, are higher than those in Examples 41 to 43 at the corresponding nitrogen atom concentrations. Namely, it is considered that in the region where the nitrogen atom concentration in the second n-type semiconductor layer was not lower than 4 atomic %, the discontinuity of the valence band having occurred on the i/n layer interface could be alleviated by insertion of the first n-type semiconductor layer made of microcrystalline silicon onto the i/n layer interface, leading to reduction in interface recombination as well as increases in open-circuit voltage, short-circuit current density, and fill factor, and thereby photoelectric conversion efficiency could be improved. Moreover, a photoelectric conversion device was manufactured by forming the second n-type semiconductor layer added with nitrogen at a concentration of 13 atomic % corresponding to Comparative Example 15 on the first n-type semiconductor layer added with no nitrogen. As in Comparative Example 15, in this photoelectric conversion device, the second n-type semiconductor layer had extremely small electric conductivity, leading to large decreases in open-circuit voltage, short-circuit current density and fill factor, and the photoelectric conversion efficiency decreased to close to zero. It was revealed from this that in the nitrogen atom concentration range of not higher than 10 atomic %, where the second n-type semiconductor layer has appropriate electric conductivity, the open-circuit voltage, the short-circuit current density and the fill factor increase by provision of the first n-type semiconductor layer.

According to the above consideration, when the nitrogen atom concentration in the second n-type semiconductor layer is in the range from 4 to 10 atomic %, formation of the first n-type semiconductor layer added with no nitrogen enables reduction in recombination at the i/n layer interface, to improve the fill factor and increase the open-circuit voltage and the short-circuit current density, and thereby photoelectric conversion efficiency can further be improved.

Next, consideration was made of the short-circuit current density in Examples 36 to 43 and Comparative Examples 14 to 15 based on FIG. 7. It is found from FIG. 7 that there are little differences in short-circuit current density among Comparative Example 14, Example 36 and Example 37. In each of Examples 38 to 43 where the n-type semiconductor layer was formed such that the nitrogen atom concentration was not lower than 0.01 atomic %, the short-circuit current density exceeded the short-circuit current density of 21.8 mA/cm$^2$ in Comparative Example 14, and it continuously increased with increase in a nitrogen atom concentration up to 10 atomic %. It is therefore considered that, with increase in a nitrogen atom concentration in the n-type semiconductor layer in the region not lower than 0.01 atomic %, light transmittance of the n-type semiconductor layer is improved, to increase an amount of light that is reflected by the electrode 16 provided on the rear surface and then re-incident on the i-type semiconductor layer 13, thus to increase the number of photoproduction carriers, resulting in an increase in short-circuit current density. Further, when the light transmittance of the single n-type semiconductor layer in each of Examples 36 to 43 and Comparative Examples 14 and 15 was measured for comparison, the light transmittance of light with a wavelength of 600 to 1,150 nm was improved with increase in a nitrogen atom concentration. This is presumably because a ratio of the silicon nitride phase having high light transmittance in the n-type semiconductor layer increases with increase in a nitrogen atom concentration in the n-type semiconductor layer. It became apparent that in Comparative Example 15, the short-circuit current density decreases due to a decrease in electric conductivity that accompanies the increase in silicon nitride phase in the n-type semiconductor layer, whereas as in Examples 38 to 43, a high short-circuit current density can be obtained with the nitrogen atom concentration in the region not higher than 10 atomic %.

It is thought from the above consideration that, when the nitrogen atom concentration in the n-type semiconductor layer is in the range from 0.01 to 10 atomic %, in addition to the foregoing improvement of the open-circuit voltage, the light transmittance of the n-type semiconductor layer is improved to increase the short-circuit current density, and thereby a photoelectric conversion device with higher photoelectric conversion efficiency can be obtained.

Comparison between Example 41 and Example 47

Next, consideration was made of the comparative results of Examples 41 and 47. In Example 47, an amorphous n-type semiconductor layer added with nitrogen was formed since a small amount of hydrogen for dilution was used during the formation. Example 41 differs from Example 47 in that a microcrystalline silicon n-type semiconductor layer added with nitrogen was formed using a large amount of hydrogen for dilution. This was confirmed by observation of measured Raman scattering spectrums of the single n-type semiconductor layers in Examples 41 and 47. A peak in the vicinity of 520 cm$^{-1}$, indicative of the presence of a crystalline silicon phase, was observed in the n-type semiconductor layer in Example 41, whereas such a peak was not observed in the n-type semiconductor layer in Example 47.

As shown in Table 4, the fill factor was 0.681 in Example 47 whereas the fill factor was 0.72 in Example 41, indicating that especially the fill factor largely improved. It is therefore considered that, with the n-type semiconductor layer containing microcrystalline silicon, electric conductivity was improved, to reduce series resistance loss of the photoelectric conversion device, leading to increases in open-circuit voltage, short-circuit current density and fill factor, and thereby a photoelectric conversion device with high photoelectric conversion efficiency could be obtained.

Examples 48 to 50

In Examples 48 to 50, the superstrate type photoelectric conversion device 100 was manufactured in the following manner under the same conditions as in Example 41 except for conditions for forming the p-type semiconductor layer 12.

In formation of the p-type semiconductor layer 12, $SiH_4$, $H_2$, $B_2H_6$, $N_2$ and $CH_4$ gas were used as raw material gases. A gas flow rate ratio ($[H_2]/[SiH_4]$) was 150, and a gas flow rate ratio ($[B_2H_6]/[SiH_4]$), a gas flow rate ratio ($[H_2]/[SiH_4]$), and a gas flow rate ratio ($[N_2]/[SiH_4]$) are as shown in Table 5. Other conditions are the same as those in Example 41. Hence the nitrogen atom concentration in the n-type semiconductor layer 14 in Examples 48 to 50 is 2 atomic %. The carbon atom concentration and the nitrogen atom concentration in the p-type semiconductor layer 12 were shown in Table 5.

Current-voltage characteristics per 1 $cm^2$ cell area of the photoelectric conversion device of Examples 48 to 50 as thus obtained were measured under an irradiation condition of AM 1.5 (100 mW/$cm^2$), and the measurement results were summarized in Table 5.

TABLE 5

|  | 5-1 | 5-2 | 5-3 | 5-4 | 5-5 | 5-6 | 5-7 | 5-8 | 5-9 |
|---|---|---|---|---|---|---|---|---|---|
| Example 41 | 0 | 0 | 0.003 | 0.002 | 0.0005 | 0.543 | 22.31 | 0.720 | 8.72 |
| Example 48 | 0.425 | 0 | 0.003 | 5.1 | 0.0005 | 0.587 | 23.18 | 0.723 | 9.84 |
| Example 49 | 0 | 0.4 | 0.005 | 0.002 | 2 | 0.594 | 24.24 | 0.722 | 10.40 |
| Example 50 | 0.425 | 0.4 | 0.01 | 5.1 | 2 | 0.602 | 24.35 | 0.723 | 10.60 |

5-1: Gas flow rate ratio ($[CH_4]/[SiH_4]$)
5-2: Gas flow rate ratio ($[N_2]/[SiH_4]$)
5-3: Gas flow rate ratio ($[B_2H_6]/[SiH_4]$)
5-4: Carbon atom concentration in the p-type semiconductor layer [atomic %]
5-5: Nitrogen atom concentration in the p-type semiconductor layer [atomic %]
5-6: Open-circuit voltage [V]
5-7: Short-circuit current density [mA/$cm^2$]
5-8: Fill factor
5-9: Photoelectric conversion efficiency [%]

Consideration of Example 41 and Examples 48 to 50

Consideration was made of Example 41 and Examples 48 to 50. In Examples 48 to 50, compared to Example 41, a high open-circuit voltage and a high short-circuit current density are obtained, and thereby high photoelectric conversion efficiency could be obtained. As in examples 48 and 49, this is presumably because, with the p-type semiconductor layer 12 containing carbon atoms or nitrogen atoms, the band gap increases, thereby improving photoelectric conversion efficiency.

As thus described, a carbon-containing p-type semiconductor layer or a nitrogen-containing p-type semiconductor layer is preferably used for the p-type semiconductor layer 12, so as to further improve the photoelectric conversion efficiency of the photoelectric conversion device 100.

Further, as in Example 50, when both carbon atoms and nitrogen atoms are contained in the p-type semiconductor layer as the impurities, the open circuit voltage and the short-circuit current density are improved and photoelectric conversion efficiency is thus improved, as compared to the case where either carbon atoms or nitrogen atoms are contained.

Example 51

In Example 51, the superstrate laminated type photoelectric conversion device shown in FIG. 2 was manufactured as follows.

As the substrate 11, the same white glass board as used in above Examples 36 to 50 with a transparent conductive film formed on the surface thereof was used. On this substrate 11, a zinc oxide layer having a thickness of 50 nm was formed by magnetron sputtering. Thereafter, under below-mentioned conditions, the photoelectric conversion layer 10 was deposited by plasma CVD in the order of the p-type semiconductor layer 12, the i-type semiconductor layer 13 and the n-type semiconductor layer 14. On this first photoelectric conversion layer 10, under the below-mentioned conditions, the second photoelectric conversion layer 20 was farther deposited by plasma CVD in the order of the p-type semiconductor layer 22, the i-type semiconductor layer 23 and the n-type semiconductor layer 24. Thereafter, on the second photoelectric conversion layer 20, a zinc oxide layer having a thickness of 50 nm as the transparent conductive layer 15, and a silver layer having a thickness of 500 nm as the electrode 16 were sequentially deposited by magnetron sputtering, to obtain a superstrate laminated type photoelectric conversion device 200.

The $N_2$ gas was not used in formation of the n-type semiconductor layer 14 of the first photoelectric conversion layer 10. Meanwhile, the $N_2$ gas was used in formation of the n-type semiconductor layer 24 of the second photoelectric conversion layer 20. In formation of the p-type semiconductor layer 12, $SiH_4$, $H_2$ and $B_2H_6$ gas were used as raw material gases. A gas flow rate ratio ($[H_2]/[SiH_4]$) was 5, and a gas flow rate ratio ($[B_2H_6]/[SiH_4]$) was adjusted such that the boron concentration in the layer was 0.1 atomic %.

The thickness of the p-type semiconductor layer 12 was 15 nm.

In formation of the i-type semiconductor layer 13, $SiH_4$ and $H_2$ gas were used as raw material gases. A gas flow rate ratio ($[H_2]/[SiH_4]$) was 20, and the layer was formed so as to have a thickness of 300 nm.

In formation of the n-type semiconductor layer 14, $SiH_4$, $H_2$ and $PH_3$ gas were used as raw material gases. A gas flow rate ratio ($[H_2]/[SiH_4]$) was 5, and a gas flow rate ratio ($[PH_3]/[SiH_4]$) was adjusted such that the phosphorous atom concentration in the layer was 0.01 atomic %. The thickness of the n-type semiconductor layer 14 was 20 nm.

It should be noted that the substrate temperature was 200° C. during formation of the p-type semiconductor layer 12, the i-type semiconductor layer 13 and the n-type semiconductor layer 14 by plasma CVD.

The p-type semiconductor layer 22, the i-type semiconductor layer 23 and the n-type semiconductor layer 24 of the second photoelectric conversion layer 20 were formed under the same conditions to have the same thicknesses as in formation of the p-type semiconductor layer 12, the i-type semiconductor layer 13 and the n-type semiconductor layer 14 in Example 41, respectively. Therefore, the nitrogen atom concentration in the n-type semiconductor layer 24 was 2 atomic %.

As in the above examples, current-voltage characteristics per 1 $cm^2$ cell area of the photoelectric conversion device of Example 51 as thus obtained were measured under an irradiation condition of AM 1.5 (100 mW/cm$^2$), and the measurement results were shown in Table 6.

Example 52

The superstrate laminated type photoelectric conversion device 200 was manufactured under the same conditions as in Example 51 except for conditions for forming the n-type semiconductor layer 14. In the present example, the N$_2$ gas was used in formation of the respective n-type semiconductor layers 14 and 24 of the first and second photoelectric conversion devices 10 and 20. In formation of the n-type semiconductor layer 14, a gas flow rate ratio ([H$_2$]/[SiH$_4$]) was 5, a gas flow rate ratio ([PH$_3$]/[SiH$_4$]) was adjusted such that the phosphorous atom concentration in the layer was 0.01 atomic %, and a gas flow rate ratio ([N$_2$]/[SiH$_4$]) was controlled such that the nitrogen atom concentration in the layer was 2 atomic %.

As in the above examples, current-voltage characteristics per 1 cm$^2$ cell area of the photoelectric conversion device of Example 52 as thus obtained were measured under an irradiation condition of AM 1.5 (100 mW/cm$^2$), and the measurement results were shown in Table 6.

Comparative Example 16

The superstrate laminated type photoelectric conversion device 200 was manufactured under the same conditions as in Example 51 except for conditions for forming the n-type semiconductor layer 24. In Comparative Example 16, the N$_2$ gas was not used in formation of the respective n-type semiconductor layers 14 and 24 of the first and second photoelectric conversion layers 10 and 20. In formation of the n-type semiconductor layer 24, a gas flow rate ratio ([H$_2$]/[SiH$_4$]) was 20, a gas flow rate ratio ([PH$_3$]/[SiH$_4$]) was adjusted such that the phosphorous atom concentration in the layer was 0.01 atomic %.

As in the above examples, current-voltage characteristics per 1 cm$^2$ cell area of the photoelectric conversion device as thus obtained were measured under an irradiation condition of AM 1.5 (100 mW/cm$^2$), and the measurement results were shown in Table 6.

TABLE 6

|  | 6-1 | 6-2 | 6-3 | 6-4 |
| --- | --- | --- | --- | --- |
| C. Example 16 | 1.396 | 11.77 | 0.738 | 12.13 |
| Example 51 | 1.413 | 11.95 | 0.740 | 12.50 |
| Example 52 | 1.435 | 12.16 | 0.741 | 12.93 |

6-1: Open-circuit voltage [V]
6-2: Short-circuit current density [mA/cm$^2$]
6-3: Fill factor
6-4: Photoelectric conversion efficiency [%]

Consideration of Examples 51 and 52, and Comparative Example 16

In the following, consideration was made of the comparative results of Examples 51 and 52, and Comparative Example 16, based upon Table 6.

In Example 51 where the n-type semiconductor layer of the second photoelectric conversion layer contained 2 atomic % of nitrogen atoms, the open-circuit voltage and the short-circuit current density were large and high photoelectric conversion efficiency was obtained, as compared to Comparative Example 16 where the n-type semiconductor layers of the first and second photoelectric conversion layers contained almost no nitrogen atoms. This is presumably because, in the second photoelectric conversion layer 20, the same effect of improving the open-circuit voltage as in Examples 37 to 43, and the same effect of improving the short-circuit current density as in Examples 38 to 43, were obtained.

Further, in Example 52 where the n-type semiconductor layers of the first and second photoelectric conversion layers both contain 2 atomic % of nitrogen atoms, in the first photoelectric conversion layer as well as the second photoelectric conversion layer, the effects of improving the open-circuit voltage and the short-circuit current density were obtained, thereby to obtain high photoelectric conversion efficiency, as compared to Example 51.

According to the above consideration, application of the example embodiment presented herein to at least one n-type semiconductor layer of a laminated type photoelectric conversion device leads to an increase in open-circuit voltage and short-circuit current density, and thereby photoelectric conversion efficiency can be improved, as in the case of the above-mentioned single-layer type photoelectric conversion device.

It is to be noted that the example embodiment is not restricted to the above examples, and a variety of parameters of the photoelectric conversion device are changeable as appropriate. Those parameters may, for example, include the thicknesses of the p-type semiconductor layer (or the first and second semiconductor layers), the i-type semiconductor layer, the n-type semiconductor layer (or the first and second semiconductor layers), the transparent conductive layer, and the electrode, and the nitrogen atom concentration and/or the impurity concentration in the p-type and n-type semiconductor layer, etc. Further, a variety of parameters of the photoelectric conversion device in manufacturing are changeable as appropriate. Those parameters may, for example, include the flow rate ratio ([N$_2$]/[SiH$_4$]), the flow rate ratio ([B$_2$H$_6$]/[SiH$_4$]), the flow rate ratio ([CH$_4$]/[SiH$_4$]), the flow rate ratio ([PH$_3$]/[SiH$_4$]), the flow rate ratio ([H$_2$]/[SiH$_4$]), and the methods, as well as the temperatures, for forming the respective layers.

What is claimed is:
1. A photoelectric conversion device comprising:
a substrate; and
a pin-type photoelectric conversion layer placed above the substrate, constituted of a p-type semiconductor layer, an i-type semiconductor layer and an n-type semiconductor layer in this order from the substrate side,
wherein the p-type semiconductor layer and the i-type semiconductor layer each contain silicon atoms as a crystalline silicon phase,
wherein the p-type semiconductor layer further contains nitrogen atoms and
boron atoms, the relationship of the nitrogen atom concentration A (atomic %) and the boron atom concentration B (atomic %) in the p-type semiconductor layer being expressed by the formula: $0.11 - 0.009A + 0.042A^2 \leq B \leq 0.2 + 0.2A + 0.05A^2$.

2. The photoelectric conversion device according to claim 1, wherein the p-type semiconductor layer contains nitrogen atoms at a concentration of 0.001 to 10 atomic %.

3. The photoelectric conversion device according to claim 1, wherein the p-type semiconductor layer has a first p-type semiconductor layer containing nitrogen atoms at a concentration of 0.5 to 10 atomic % and a second p-type semiconductor layer containing silicon atoms as a crystalline silicon phase.

4. The photoelectric conversion device according to claim 1, wherein the p-type semiconductor layer contains nitrogen atoms at a concentration of 0.01 to 15 atomic %.

5. The photoelectric conversion device according to claim 1, wherein the crystalline silicon phase of the p-type semiconductor layer has an intensity ratio (Ic/Ia) of a peak height of the crystalline silicon phase Ic to a peak height of an amorphous silicon phase Ia of crystalline volume fraction in a measured spectrum of Raman scattering spectroscopy of not less than 3.

6. The photoelectric conversion device according to claim 1, wherein the p-type semiconductor layer has no absorption peak in the wavenumber range of 1,800 to 1,950 $cm^{-1}$ in a measured phonon spectrum.

7. The photoelectric conversion device according to claim 1, wherein the pin-type photoelectric conversion layer comprises not less than two pin-type photoelectric conversion layers, and at least one of the p-type semiconductor layers contains nitrogen atoms.

8. The photoelectric conversion device according to claim 1, wherein
   the i-type semiconductor layer is deposited on a substrate of the p-type semiconductor layer.

* * * * *